(12) United States Patent
Liao et al.

(10) Patent No.: US 10,032,662 B2
(45) Date of Patent: Jul. 24, 2018

(54) PACKAGED SEMICONDUCTOR DEVICES AND PACKAGING METHODS THEREOF

(71) Applicant: Taiwan Semiconductor Manufacturing Company, Ltd., Hsin-Chu (TW)

(72) Inventors: Shu-Hang Liao, Hsin-Chu (TW); Ying-Ching Shih, Hsin-Chu (TW); Szu-Wei Lu, Hsin-Chu (TW); Jing-Cheng Lin, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 14/509,973

(22) Filed: Oct. 8, 2014

(65) Prior Publication Data
US 2016/0104694 A1  Apr. 14, 2016

(51) Int. Cl.
*H01L 21/56* (2006.01)
*H01L 21/683* (2006.01)
(Continued)

(52) U.S. Cl.
CPC ........ *H01L 21/6835* (2013.01); *H01L 21/561* (2013.01); *H01L 21/568* (2013.01); *H01L 21/78* (2013.01); *H01L 24/19* (2013.01); *H01L 24/20* (2013.01); *H01L 24/96* (2013.01); *H01L 24/97* (2013.01); *H01L 25/03* (2013.01); *H01L 25/50* (2013.01); *H01L 23/3128* (2013.01); *H01L 23/544* (2013.01); *H01L 24/32* (2013.01); *H01L 24/48* (2013.01); *H01L 24/73* (2013.01); *H01L 24/83* (2013.01); *H01L 24/92* (2013.01); *H01L 25/105* (2013.01); *H01L 2221/68327* (2013.01); *H01L 2221/68359* (2013.01); *H01L 2221/68368* (2013.01); *H01L 2221/68372* (2013.01); *H01L 2223/54433* (2013.01); *H01L 2223/54486* (2013.01); *H01L 2224/04105* (2013.01); *H01L 2224/12105* (2013.01); *H01L 2224/19* (2013.01); *H01L 2224/32145* (2013.01); *H01L 2224/32225* (2013.01); *H01L 2224/48091* (2013.01); *H01L 2224/48227* (2013.01); *H01L 2224/73265* (2013.01); *H01L 2224/73267* (2013.01); *H01L 2224/92244* (2013.01); *H01L 2224/97* (2013.01); *H01L 2225/0651* (2013.01); *H01L 2225/06568* (2013.01); *H01L 2225/1035* (2013.01); *H01L 2225/1041* (2013.01);
(Continued)

(58) Field of Classification Search
CPC ...... H01L 24/96–24/97; H01L 25/065–25/074
See application file for complete search history.

(56) References Cited

U.S. PATENT DOCUMENTS 6,093,972 A * 7/2000 Carney ................. H01L 21/561
257/738
2004/0251530 A1* 12/2004 Yamaji ................ H01L 25/0657
257/686
(Continued)

FOREIGN PATENT DOCUMENTS

KR  20060125582 A  12/2006
KR  20140061959 A  5/2014

*Primary Examiner* — Xinning Niu
*Assistant Examiner* — Sean Hagan
(74) *Attorney, Agent, or Firm* — Slater Matsil, LLP

(57) ABSTRACT

Packaged semiconductor devices and methods of packaging thereof are disclosed. In some embodiments, a packaged semiconductor device includes a first device and a second device coupled to the first device. The second device includes an integrated circuit die covered by a molding compound. An over-mold structure is disposed over the second device.

20 Claims, 25 Drawing Sheets

(51) Int. Cl.
  *H01L 21/78* (2006.01)
  *H01L 23/00* (2006.01)
  *H01L 23/544* (2006.01)
  *H01L 25/00* (2006.01)
  *H01L 25/03* (2006.01)
  *H01L 25/10* (2006.01)
  *H01L 23/31* (2006.01)

(52) U.S. Cl.
  CPC .............. *H01L 2225/1058* (2013.01); *H01L 2924/00014* (2013.01); *H01L 2924/14* (2013.01); *H01L 2924/15311* (2013.01); *H01L 2924/181* (2013.01)

(56) References Cited

U.S. PATENT DOCUMENTS

| | | | |
|---|---|---|---|
| 2006/0267175 A1 | 11/2006 | Lee | |
| 2009/0102060 A1* | 4/2009 | Goida | H01L 24/83 257/777 |
| 2009/0146315 A1* | 6/2009 | Shim, II | H01L 23/552 257/777 |
| 2009/0189279 A1* | 7/2009 | How | H01L 21/568 257/737 |
| 2010/0140779 A1* | 6/2010 | Lin | H01L 23/49816 257/690 |
| 2010/0244216 A1* | 9/2010 | Huang | H01L 21/561 257/686 |
| 2011/0014746 A1* | 1/2011 | Do | H01L 21/568 438/107 |
| 2011/0062592 A1* | 3/2011 | Lee | H01L 21/561 257/774 |
| 2011/0187005 A1* | 8/2011 | Pagaila | H01L 25/0657 257/777 |
| 2013/0122689 A1* | 5/2013 | Wang | H01L 21/6835 438/464 |
| 2014/0091471 A1 | 4/2014 | Chen et al. | |
| 2014/0131858 A1 | 5/2014 | Pan et al. | |

\* cited by examiner

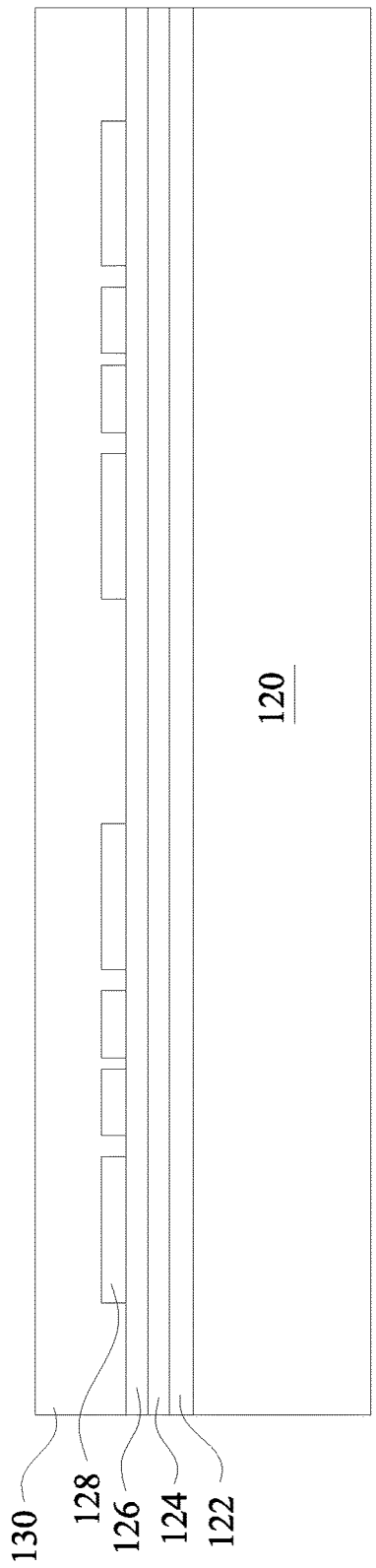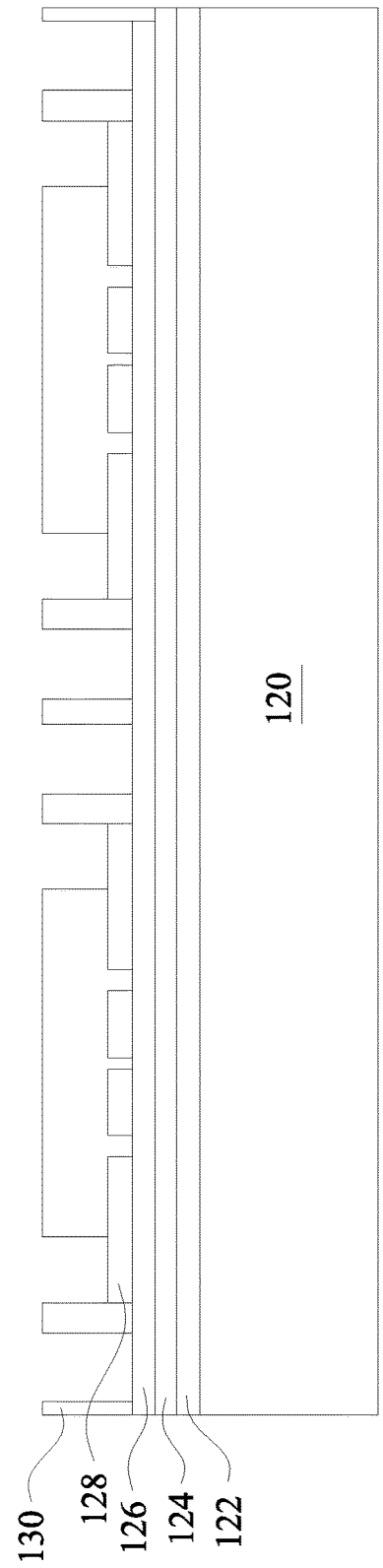

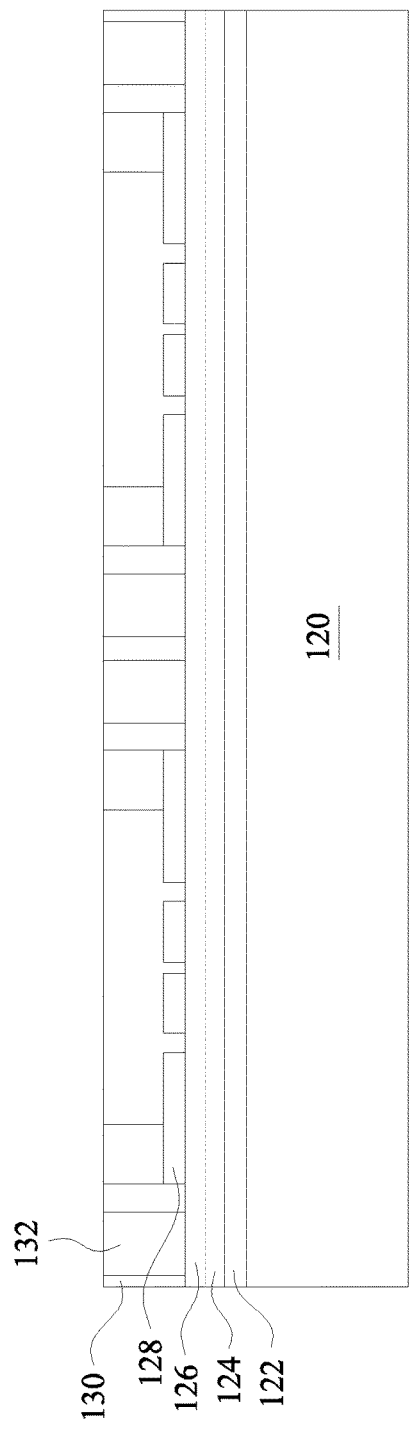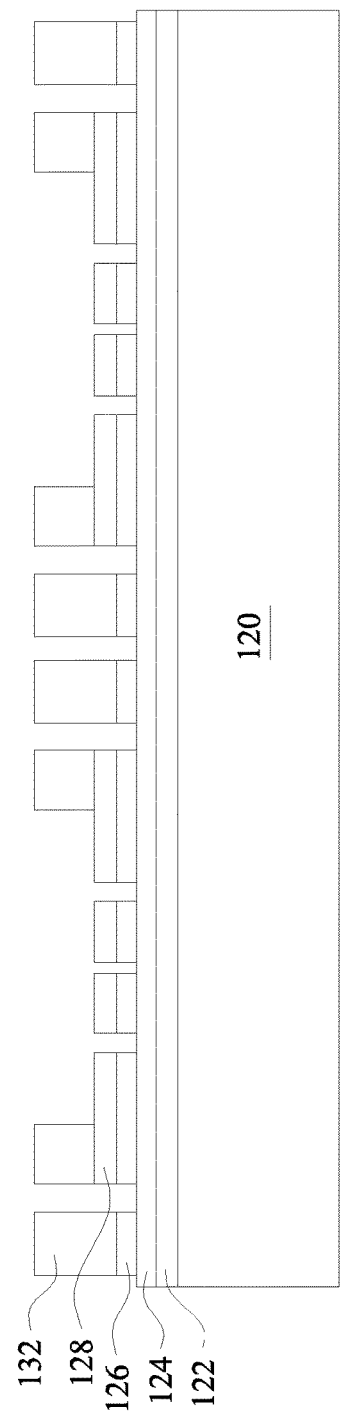

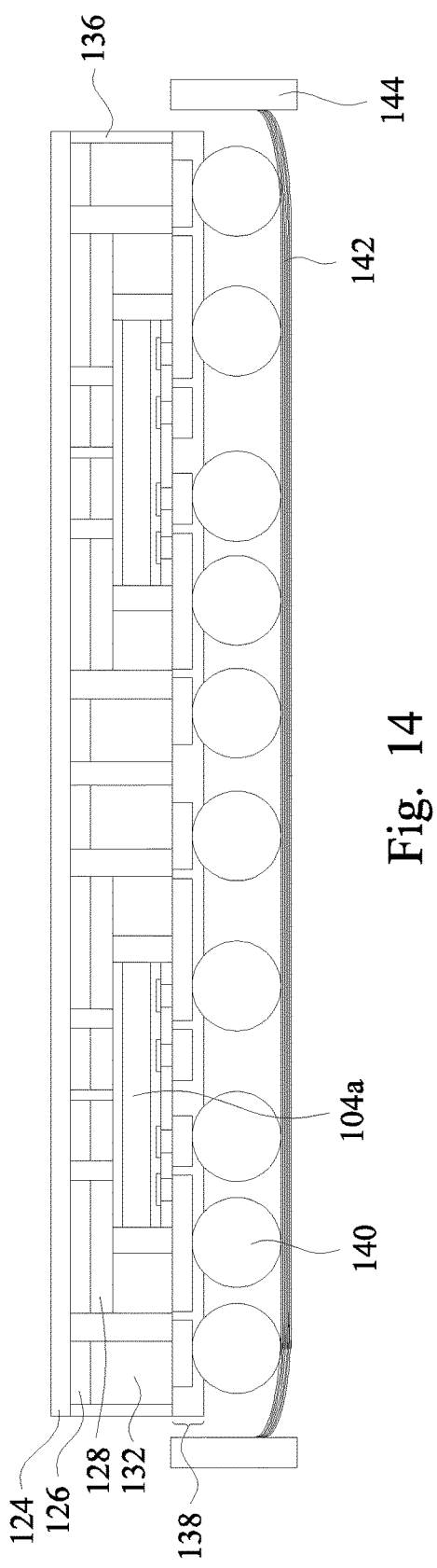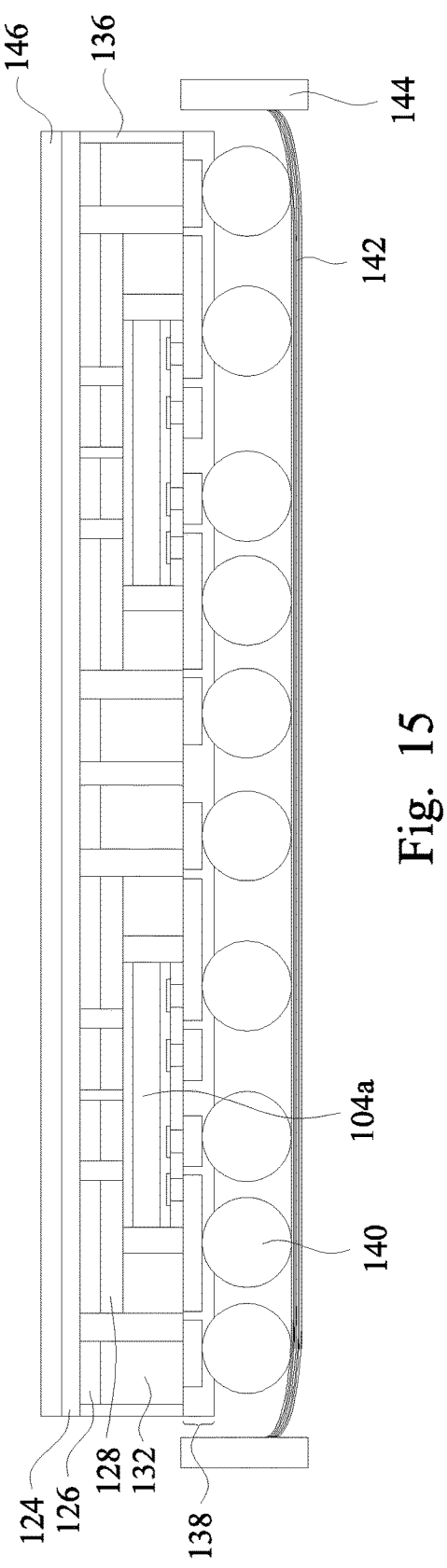

PACKAGED SEMICONDUCTOR DEVICES AND PACKAGING METHODS THEREOF

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along scribe lines. The individual dies are then packaged separately, in multi-chip modules, or in other types of packaging.

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed, and greater bandwidth, as well as lower power consumption and latency has grown recently, there has grown a need for smaller and more creative packaging techniques for semiconductor dies.

As semiconductor technologies further advance, stacked semiconductor devices, e.g., 3D integrated circuits (3DICs), have emerged as an effective alternative to further reduce the physical size of semiconductor devices. In a stacked semiconductor device, active circuits such as logic, memory, processor circuits, and the like are fabricated on different semiconductor wafers. Two or more semiconductor wafers may be installed or stacked on top of one another to further reduce the form factor of the semiconductor device. Package-on-package (PoP) devices are one type of 3DIC wherein dies are partially packaged and are then packaged together with another partially packaged die or dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4 through 12 are cross-sectional views that illustrate a method of packaging semiconductor devices at various stages in accordance with some embodiments.

FIGS. 13 through 21 are cross-sectional views that illustrate a method of packaging semiconductor devices at various stages in accordance with some embodiments.

DETAILED DESCRIPTION

Figure 1:
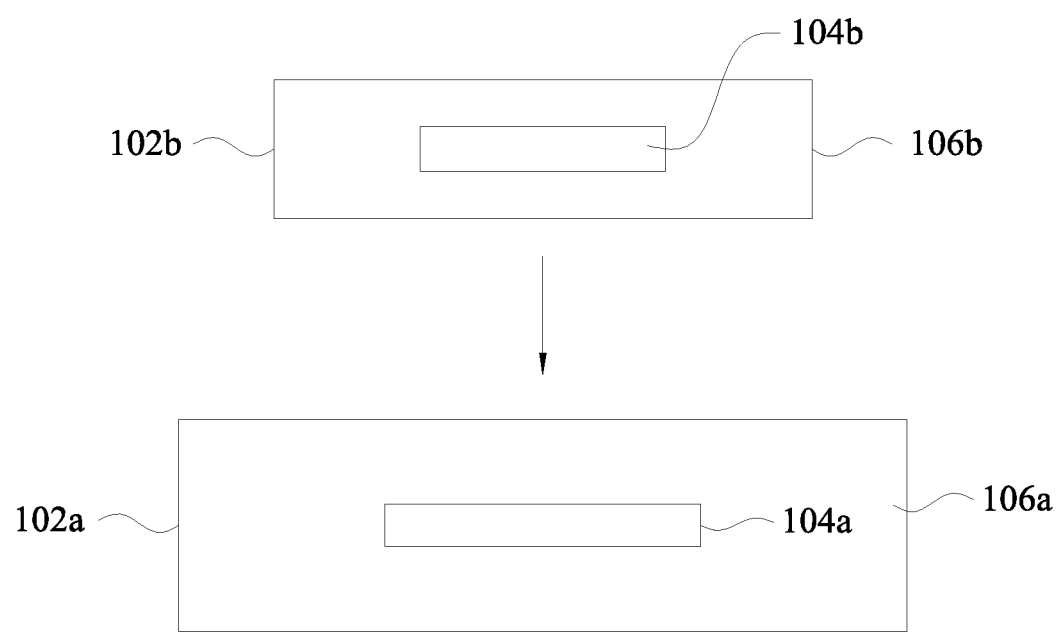
FIGS. 1 through 3 are cross-sectional views illustrating a method of packaging semiconductor devices in accordance with some embodiments of the present disclosure, wherein an over-mold structure is disposed over a device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Packaged semiconductor devices and methods of packaging semiconductor devices are disclosed in the present disclosure. Two devices are coupled together, and an over-mold structure is formed thereon. The over-mold structure comprises a molded underfill material or a laminated molding compound material. The inclusion of the over-mold structure in a packaged semiconductor device advantageously avoids the need for an underfill material to be disposed between the devices using an additional packaging process step. The over-mold structure provides other advantages, such as providing support and preventing chipping and peeling.

Figure 2:
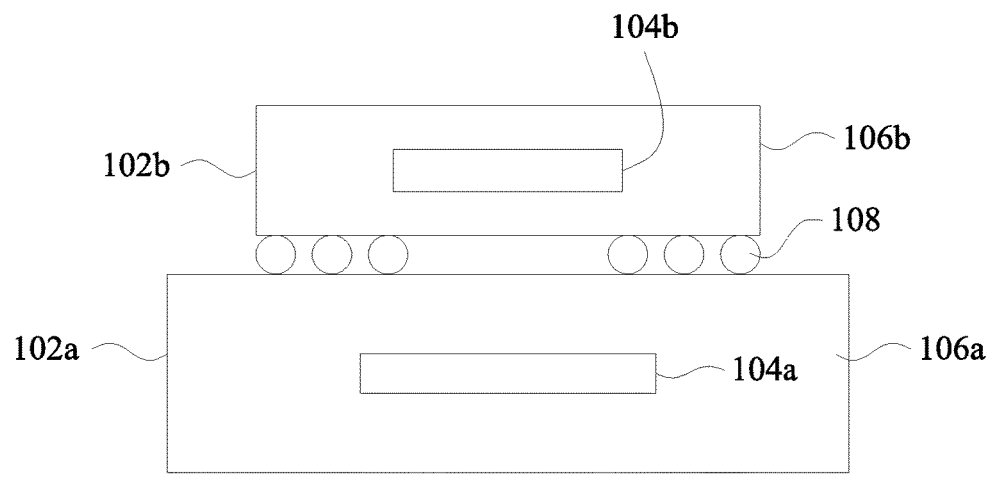
Figure 3:
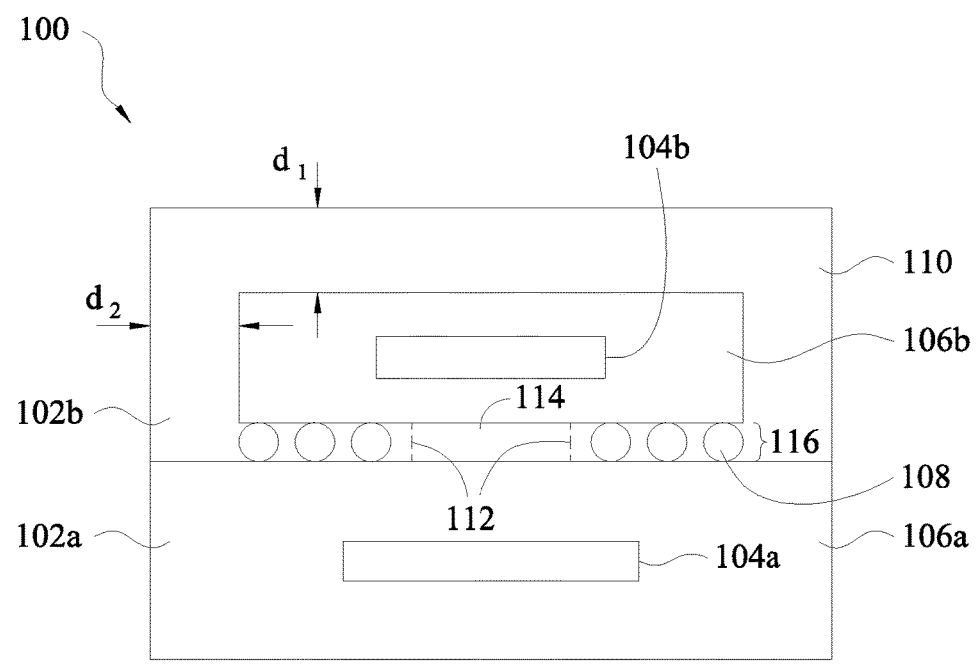

FIGS. 1 through 3 are cross-sectional views illustrating a method of packaging semiconductor devices at various stages in accordance with some embodiments of the present disclosure, wherein an over-mold structure is disposed over a device. Referring first to FIG. 1, to package semiconductor devices in accordance with some embodiments, a first device 102a is provided. The first device 102a comprises a first partially packaged semiconductor device 102a in some embodiments. The first partially packaged semiconductor device 102a comprises a first integrated circuit die 104a that is partially packaged using a plurality of packaging elements 106a. The packaging elements 106a may include molding and/or underfill materials, interconnect structures, through-vias, and the like, not shown.

A second device 102b is also provided. The second device 102b comprises a second partially packaged semiconductor device 102b in some embodiments. The second partially packaged semiconductor device 102b comprises a second integrated circuit die 104b that is partially packaged using a plurality of packaging elements 106b. The packaging elements 106b may include molding and/or underfill materials, interconnect structures, through-vias, and the like, not shown. The packaging elements 106b may be similar to, the same as, or different than packaging elements 106a of the first device 102a. The second integrated circuit die 104b may comprise a different or a similar type of die as the first integrated circuit die 104a, for example. The second integrated circuit die 104b comprises a substrate in some embodiments.

The second device 102b is coupled to the first device 102a using a plurality of connectors 108, as illustrated in FIGS. 1 and 2. The second device 102b is coupled to a top surface of the first device 102a, for example. Contact pads (not shown) disposed on the second device 102b are coupled to contact pads (also not shown) disposed on the first device 102a using the connectors 108 in some embodiments. A material of the connectors 108 may be disposed on the contact pads of the first device 102a and/or the second device 102b. The material of the connectors 108 comprises a eutectic material such as solder that is adapted to melt at a predetermined temperature, for example. When the eutectic material cools, the connectors 108 are formed that electrically and mechanically couple together the contact pads of the first device 102a and the second device 102b. The plurality of connectors 108 is also referred to herein (e.g., in some of the claims) as a plurality of first connectors or a plurality of second connectors, depending on the order of introduction. The plurality of connectors 108 comprises bumps in some embodiments, for example.

Referring next to FIG. 3, an over-mold structure 110 is then formed over the second device 102b in accordance with some embodiments. The packaged semiconductor device 100 includes the over-mold structure 110 that is formed over the top surface and sidewalls of the second device 102b. The over-mold structure 110 is also formed around the plurality of connectors 108. The over-mold structure 110 is formed around and between the plurality of connectors 108 in some embodiments, as illustrated in FIG. 3. The over-mold structure 110 is formed over a substrate of the second integrated circuit die 104b of the second device 102b in some embodiments.

Figure 17:
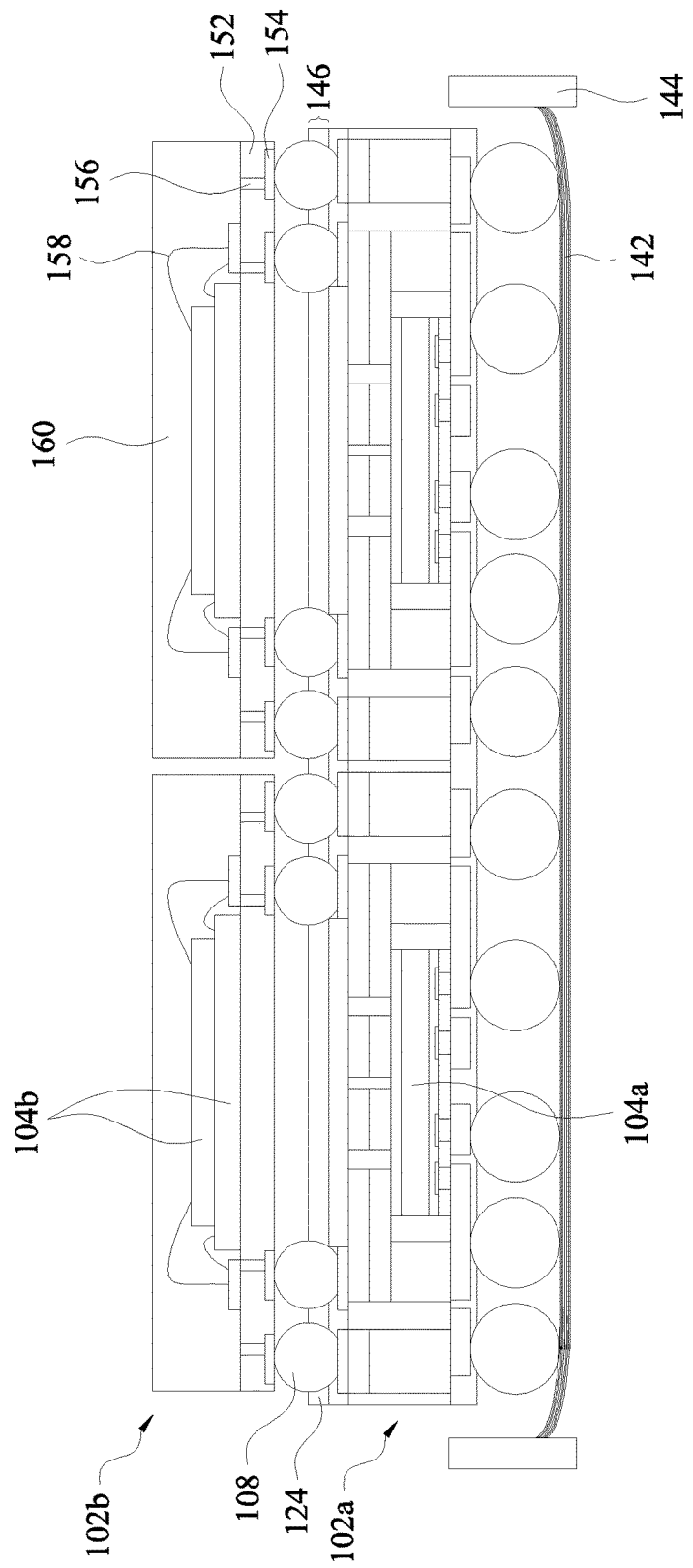

In some embodiments, the upper material layer of the packaging elements 106b comprises a molding compound, and the over-mold structure 110 is formed over the molding compound (not shown in FIGS. 1 through 3; see molding compound 160 shown in FIG. 17).

Referring again to FIG. 3, the over-mold structure 110 comprises a molding underfill (MUF) material or a laminate molding compound (LMC) in some embodiments, to be described further herein. The over-mold structure 110 comprises a binder combined with a filler in some embodiments, for example. The over-mold structure 110 may comprise a binder comprising an organic polymer and a filler comprising an inorganic material such as a ceramic, as examples. Alternatively, the over-mold structure 110 may comprise other materials.

In some embodiments, the over-mold structure 110 is formed around the plurality of connectors 108 disposed between the first device 102a and the second device 102b, but the over-mold structure 110 is not formed in a central region 114 disposed between the first device 102a and the second device 102b. For example, the over-mold structure 110 material may comprise edges 112 proximate the central region 114 disposed between the first device 102a and the second device 102b, in some embodiments. A material of the over-mold structure 110 is disposed partially between the second device 102b and the first device 102a in some embodiments, for example. The material of the over-mold structure 110 is disposed partially between the second device 102b and the first device 102a in embodiments wherein the over-mold structure 110 comprises a LMC, as another example. The LMC is disposed around and between the plurality of connectors 108 after the over-mold structure 110 is formed, for example.

In other embodiments, the over-mold structure 110 substantially completely fills the space 116 between the first device 102a and the second device 102b. A material of the over-mold structure 110 is disposed substantially completely between the second device 102b and the first device 102a in some embodiments, for example. A material of the over-mold structure 110 is disposed substantially completely between the second device 102b and the first device 102a in embodiments wherein the over-mold structure 110 comprises a MUF material, as another example.

The over-mold structure 110 comprises a thickness over a top surface of the second device 102b comprising dimension $d_1$ in some embodiments, wherein dimension $d_1$ comprises about 200 μm or less. Dimension $d_1$ comprises about 30 μm to about 80 μm in some embodiments. In other embodiments, dimension $d_1$ comprises about 80 μm to about 160 μm, for example. The over-mold structure 110 comprises a thickness over the sidewalls of the second device 102b comprising dimension $d_2$ in some embodiments, wherein dimension $d_2$ comprises about 300 μm or less. Dimension $d_2$ comprises about 100 μm to about 150 μm in some embodiments. In other embodiments, dimension $d_2$ comprises about 150 μm to about 300 μm, for example. Dimension $d_1$ may be larger than dimension $d_2$, or dimension $d_1$ may be less than dimension $d_2$. The difference between dimensions $d_1$ and $d_2$ comprises about 20 μm to about 50 μm in some embodiments. In other embodiments, the difference between dimensions $d_1$ and $d_2$ comprises about 50 μm to about 100 μm, for example. In some embodiments, dimensions $d_1$ and $d_2$ may be substantially the same. Alternatively, dimensions $d_1$ and $d_2$ may comprise other values and relative values.

Generally, in some embodiments, a method of packaging semiconductor devices comprises partially packaging a plurality of first integrated circuit dies 104a, partially packaging a plurality of second integrated circuit dies 104b, and coupling each of the plurality of partially packaged second integrated circuit dies 104b (e.g., second devices 102b) to one of the partially packaged first integrated circuit dies 104a (e.g., first devices 102a). The method includes forming the over-mold structure 110 over top surfaces and sidewalls of the plurality of partially packaged second integrated circuit dies 104b, and singulating or dicing the over-mold structure 110 and the plurality of partially packaged first integrated circuit dies 104a to form a plurality of packaged semiconductor devices 100, to be described further herein.

FIGS. 4 through 12 are cross-sectional views that illustrate a method of packaging semiconductor devices at various stages in accordance with some embodiments. More details of an exemplary method of partially packaging a plurality of first integrated circuit dies 104a (see FIG. 10) in accordance with some embodiments are shown.

Figure 4:
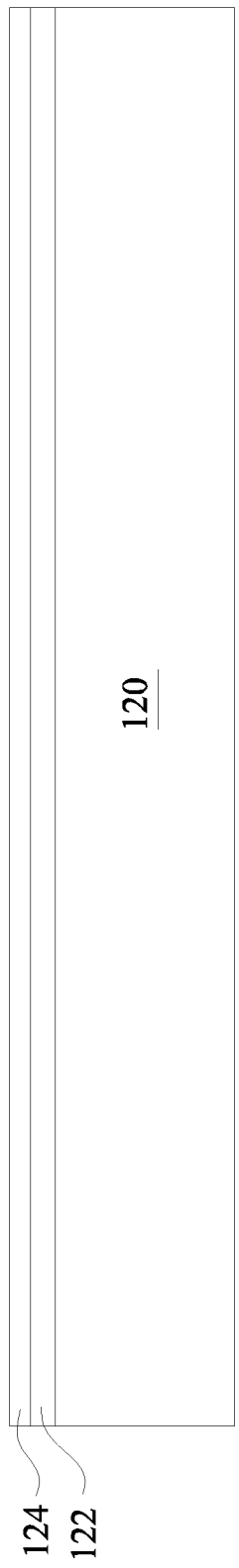

In FIG. 4, a carrier 120 is provided. The carrier 120 may comprise a carrier wafer or strip, as examples. The carrier 120 may comprise glass, a semiconductor material, or other materials.

An adhesive 122 is coupled to the carrier 120, also shown in FIG. 4. The adhesive 122 may comprise a glue, tape, or other materials with adhesive properties. An insulating material 124 is formed over the adhesive 122. The insulating material 124 may comprise polybenzoxazole (PBO), polyimide (PI), benzocyclobutene (BCB), solder resist (SR), other materials, or a combination or multiple layers thereof, for example. Alternatively, the insulating material 124 may comprise other materials. Layers 124 and 122 comprise a glue/polymer base buffer layer in some embodiments, for example.

Figure 5:
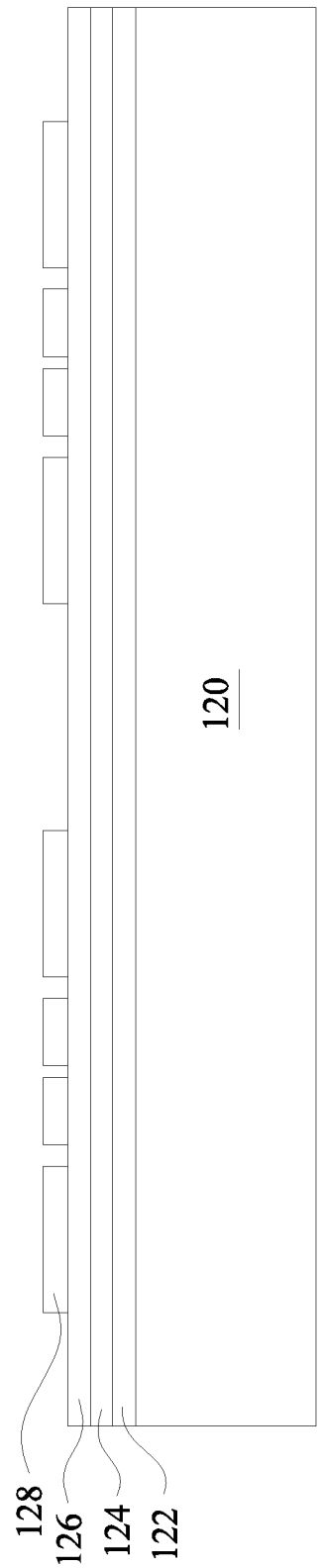

A seed layer 126 is formed over the insulating material 124, as shown in FIG. 5. The seed layer 126 may be formed by physical vapor deposition (PVD) or other methods, for example. The seed layer 126 may comprise several nm of copper or a copper alloy, as examples. Alternatively, the seed layer 126 may comprise other materials and dimensions.

Conductive features 128 are formed over the seed layer 126 in some embodiments. The conductive features 128 may comprise conductive features of an interconnect structure. The interconnect structure may comprise a redistribution layer (RDL) or a post passivation interconnect (PPI) structure in some embodiments. The conductive features 128 may comprise conductive lines, vias, contact pads, and/or other types of features. The conductive features 128 may be formed using subtractive techniques, by forming a material layer over the seed layer 126, and patterning the material layer using lithography to form the conductive features 128. Alternatively, the conductive features 128 may be formed using damascene methods. The conductive features 128 may also be formed using other methods. The conductive features 128 comprise conductive features of a first RDL in some embodiments. The first RDL comprises a back side RDL in some embodiments, as another example.

A layer of photoresist 130 is formed over the conductive features 128 and the seed layer 126, as shown in FIG. 6. The layer of photoresist 130 is patterned using photolithography with a pattern for a plurality of through-vias, exposing portions of the seed layer 126 and the conductive features 128, as shown in FIG. 7. A plating process is used to form a conductive material 132 over the exposed portions of the seed layer 126 and conductive features 128, as shown in FIG. 8. The plating process may comprise an electro-plating or other type of process.

The layer of photoresist 130 is then stripped or removed, exposing portions of the seed layer 126, conductive features 128, and insulating material 124, as shown in FIG. 9. Exposed portions of the seed layer 126 are removed using an etching process or other process, also shown in FIG. 9, leaving a plurality of the through-vias 126/132 and 132 formed across the surface of the carrier 120. Some of the through-vias 126/132 are formed over the insulating material 124 and comprise the seed layer 126 and the conductive material 132. Others of the through-vias 132 are formed over the conductive features 128, which also include the seed layer 126. Thus, some of the through-vias 132 comprise only the conductive material 132. The through-vias 126/132 and 132 may comprise a width of about 20 µm to about 300 µm in a top view. The through-vias 126/132 and 132 may comprise a circular, oval, square, rectangular, or polygon shape in the top view, as examples. Alternatively, the through-vias 126/132 and 132 may comprise other shapes and dimensions. The through-vias 126/132 and 132 provide vertical electrical connections for the first partially packaged devices 102a (see FIG. 16) in some embodiments, for example. The exposed conductive features 128 comprise an under-ball metallization (UBM) structure in some embodiments.

Figure 10:
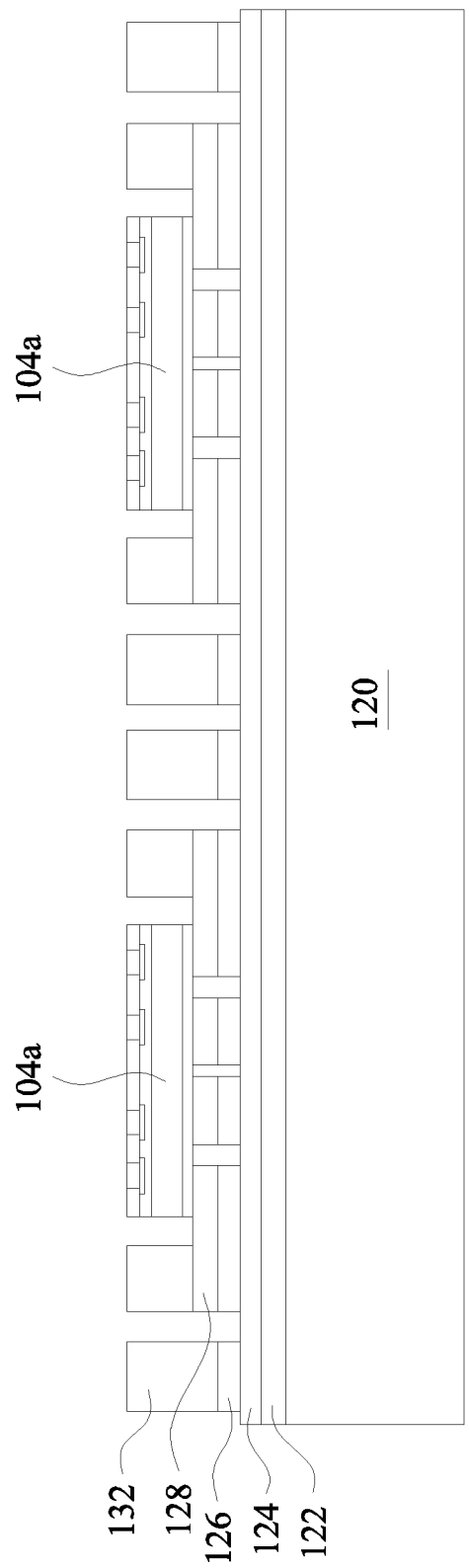

Referring next to FIG. 10, a plurality of first integrated circuit dies 104a is then attached to the carrier 120. Each first integrated circuit die 104a is attached in a die mounting region disposed between the through-vias 126/132 and 132. The plurality of first integrated circuit dies 104a is coupled to the conductive features 128 of the first RDL disposed over the carrier 120 in some embodiments, for example. The plurality of first integrated circuit dies 104a may each include a substrate and active regions that contain circuitry disposed within the substrate. The plurality of first integrated circuit dies 104a may also each include a plurality of contact pads formed thereon. The plurality of contact pads may be disposed within an insulating material. The plurality of first integrated circuit dies 104a may also include other features and/or elements.

Figure 11:
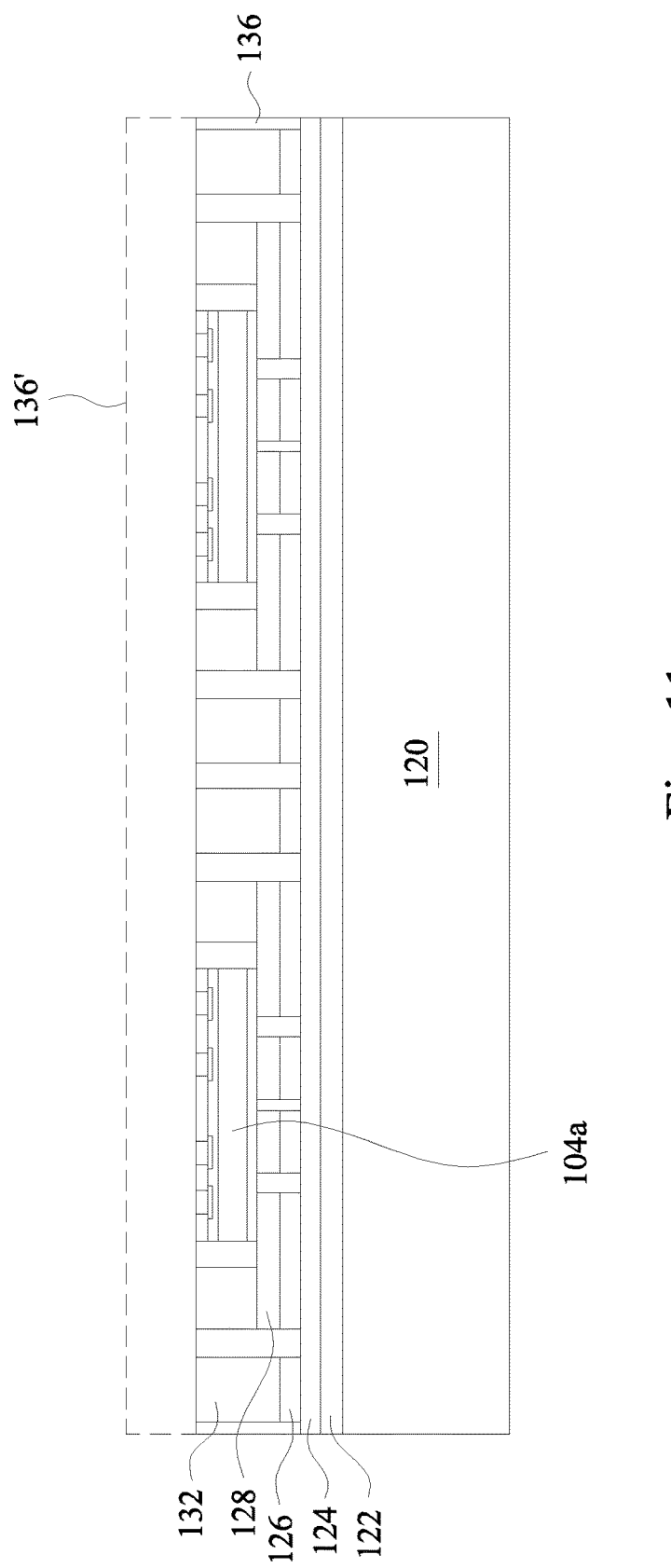

A molding material 136 is formed over the plurality of first integrated circuit dies 104a and the plurality of through-vias 126/132 and 132, as shown in FIG. 11. The molding material 136 is formed around the plurality of first integrated circuit dies 104a and the plurality of through-vias 126/132 and 132. The molding material 136 comprises a molding compound comprised of an insulating material, such as an epoxy, a filler material, a stress release agent (SRA), an adhesion promoter, other materials, or combinations thereof, as examples.

As deposited, the molding material 136 may extend over top surfaces of the plurality of first integrated circuit dies 104a and the plurality of through-vias 126/132 and 132, as shown in phantom (e.g., in dashed lines) at 136' in FIG. 11. A chemical-mechanical polishing (CMP) process, a grinding process, an etch process, other methods, or a combination thereof is used to remove the molding material 136 from over top surfaces of the plurality of first integrated circuit dies 104a and the plurality of through-vias 126/132 and 132. A top portion of the through-vias 126/132 and 132 may also be removed in some embodiments, reducing their height or thickness.

Figure 12:
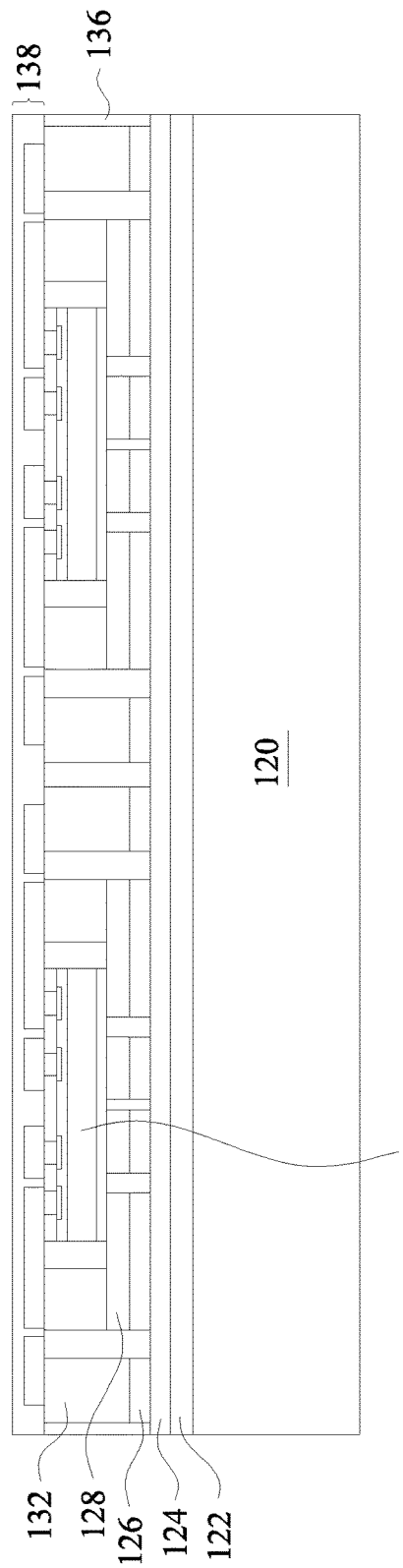

An interconnect structure 138 is then formed over the molding material 136, the plurality of first integrated circuit dies 104a, and the plurality of through-vias 126/132 and 132, as shown in FIG. 12. The interconnect structure 138 comprises one or more conductive feature layers and one or more insulating material layers. The interconnect structure 138 comprises an RDL or PPI structure in some embodiments. The conductive feature layers of the interconnect structure 138 may comprise conductive lines, conductive vias, and/or contact pads comprised of copper, copper alloys, or other materials, as examples. The insulating material layers of the interconnect structure 138 may comprise silicon dioxide, low dielectric constant (k) materials having a k value less than silicon dioxide, passivation materials, other insulating materials, or multiple layers or combinations thereof, as examples. The interconnect structure 138 comprises a second RDL in some embodiments. The first RDL comprising the conductive features 128 and the second RDL 138 provide horizontal electrical connections for the first partially packaged devices 102a (see FIG. 16) in some embodiments, for example.

Figure 13:
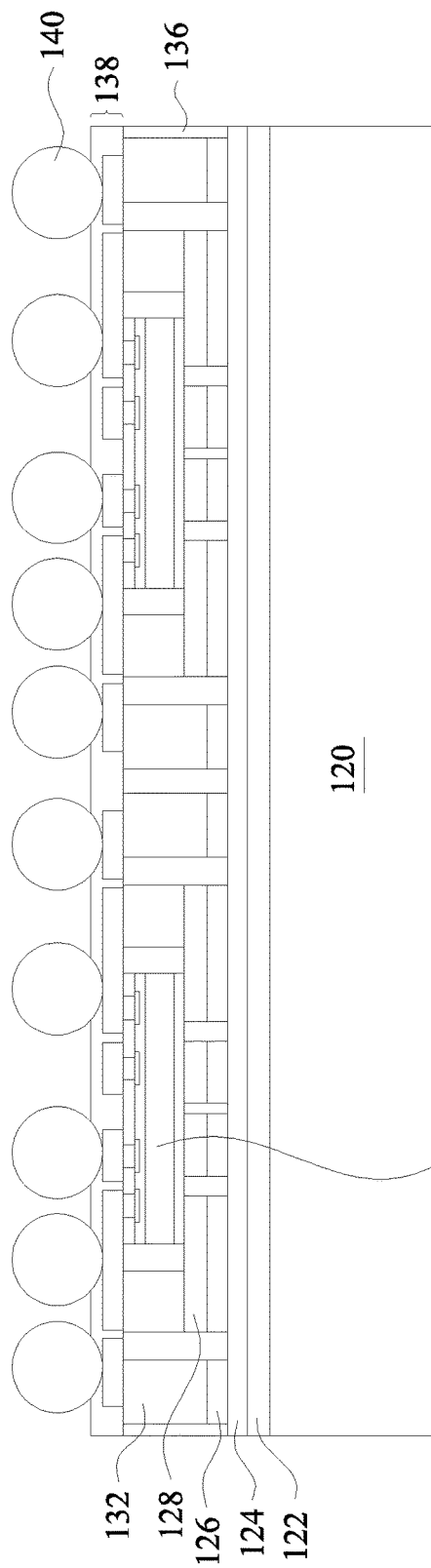

At this stage of the packaging process, the packaging method continues as shown in FIG. 13 through FIG. 22 or FIG. 23, FIGS. 24 through 28, FIGS. 29 and 30, or FIGS. 31 and 32. For example, FIGS. 13 through 21 are cross-sectional views that illustrate methods of packaging semiconductor devices at various stages in accordance with some embodiments. After the interconnect structure 138 comprising a second RDL is formed over the molding material 136, the plurality of first integrated circuit dies 104a, and the plurality of through-vias 126/132 and 132 as shown in FIG. 12, a plurality of connectors 140 is formed over the second RDL 138, as shown in FIG. 13. The plurality of connectors 140 comprises a eutectic material such as solder or other materials. The connectors 140 may be formed using a ball drop process or other process. The plurality of connectors 140 is coupled to conductive features or contact pads of the second RDL 138 and may be arranged in an array, such as a ball grid array (BGA). The plurality of connectors 140 is also referred to herein (e.g., in some of the claims) as a plurality of first connectors or a plurality of second connectors, depending on the order of introduction. The plurality of connectors 140 may be mounted using a ball mount process, after which a test is performed on the plurality of connectors 140 in some embodiments, for example.

The first integrated circuit dies 104a are then inverted, and the plurality of connectors 140 is coupled to a tape 142, as shown in FIG. 14. The tape 142 may comprise a tape carrier, for example. The tape 142 may be coupled to and supported by a support 144. The carrier 120 is then removed or de-bonded from the first integrated circuit dies 104a, and the adhesive 122 is removed, also shown in FIG. 14.

An insulating material 146 is then formed over the insulating material 124, as shown in FIG. 15. The insulating material 146 may comprise a mixture of organic binders (such as thermoset and thermal plastic polymers) and inorganic fillers (such as ceramic and conductive powders) comprising dimensions $d_1$ and/or $d_2$ as described with reference to FIG. 3, as examples. Alternatively, the insulating material 146 may comprise other dimensions and materials.

Figure 16:
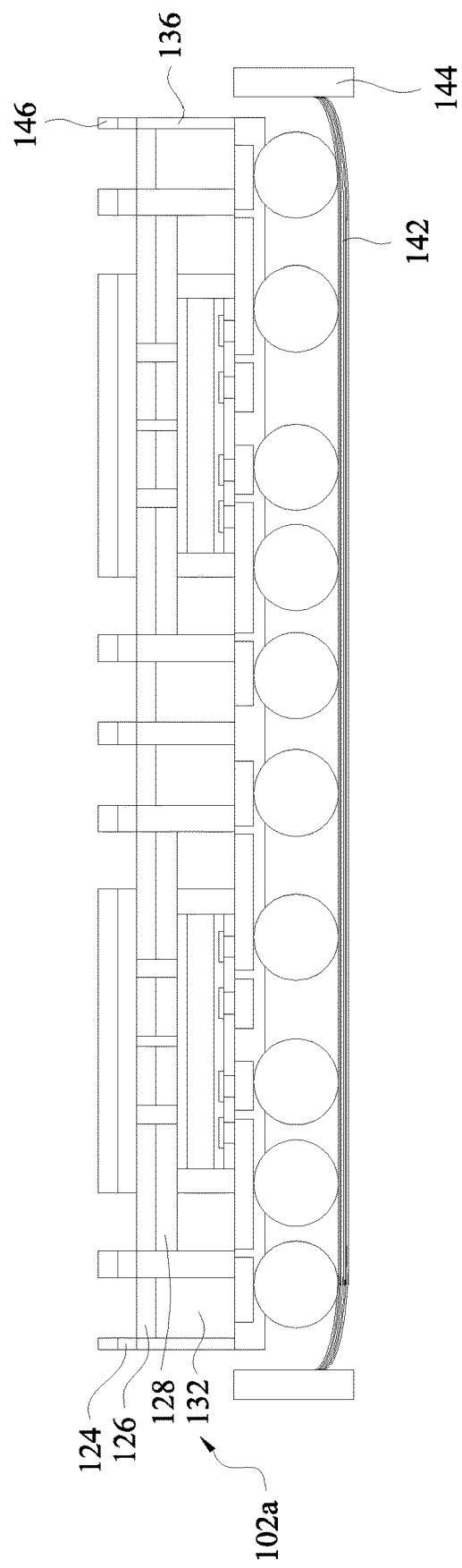

In FIG. 16, openings are formed in insulating materials 146 and 124 to expose the seed layer 126, the through-vias 126/132, and the conductive features 128 (which are coupled to portions of the seed layer 126 in some embodiments). The openings may be formed using a laser drilling process, a lithography process, or other methods. Any remaining residue left remaining over the openings is then cleaned.

A eutectic material such as solder or a solder paste is then applied within the openings in insulating materials 146 and 124 to form connectors 108, as shown in FIG. 17. A solder flux may also be applied. A plurality of partially packaged second integrated circuit dies 104b (e.g., second devices 102b) is then provided. Each of the plurality of partially packaged second integrated circuit dies 104b is coupled to one of the partially packaged first integrated circuit dies 104a, also shown in FIG. 17. Contact pads 154 of the second devices 102b are aligned with the connectors 108, and the eutectic material of the connectors 108 is re-flowed, mechanically and electrically bonding the second partially packaged devices 102b to the first partially packaged devices 102a.

The second devices 102b may comprise a substrate 152 that the contact pads 154 are disposed on. The substrate 152 may include one or more interconnect structures formed thereon that provide horizontal connections for the second device 102b in some embodiments, not shown. The substrate 152 may also include a plurality of through-vias 156 formed therein. One or more integrated circuit dies 104b may be coupled to a top surface of the substrate 152. The second devices 102b comprise two stacked integrated circuit dies 104b that are partially packaged together in FIG. 17, for example. The integrated circuit die 104b is coupled to contact pads (not shown) on a top surface of the substrate 152 by wire bonds 158. The wire bonds 158 and the through-vias 156 provide vertical electrical connections for the second device 102b in some embodiments, for example. A molding compound 160 may be disposed over the integrated circuit dies 104b, the wire bonds 158, and the substrate 152. The molding compound 160 may comprise similar materials as described for the molding material 136 of the first device 102a. Alternatively, the molding compound 160 may comprise other materials.

Figure 18:
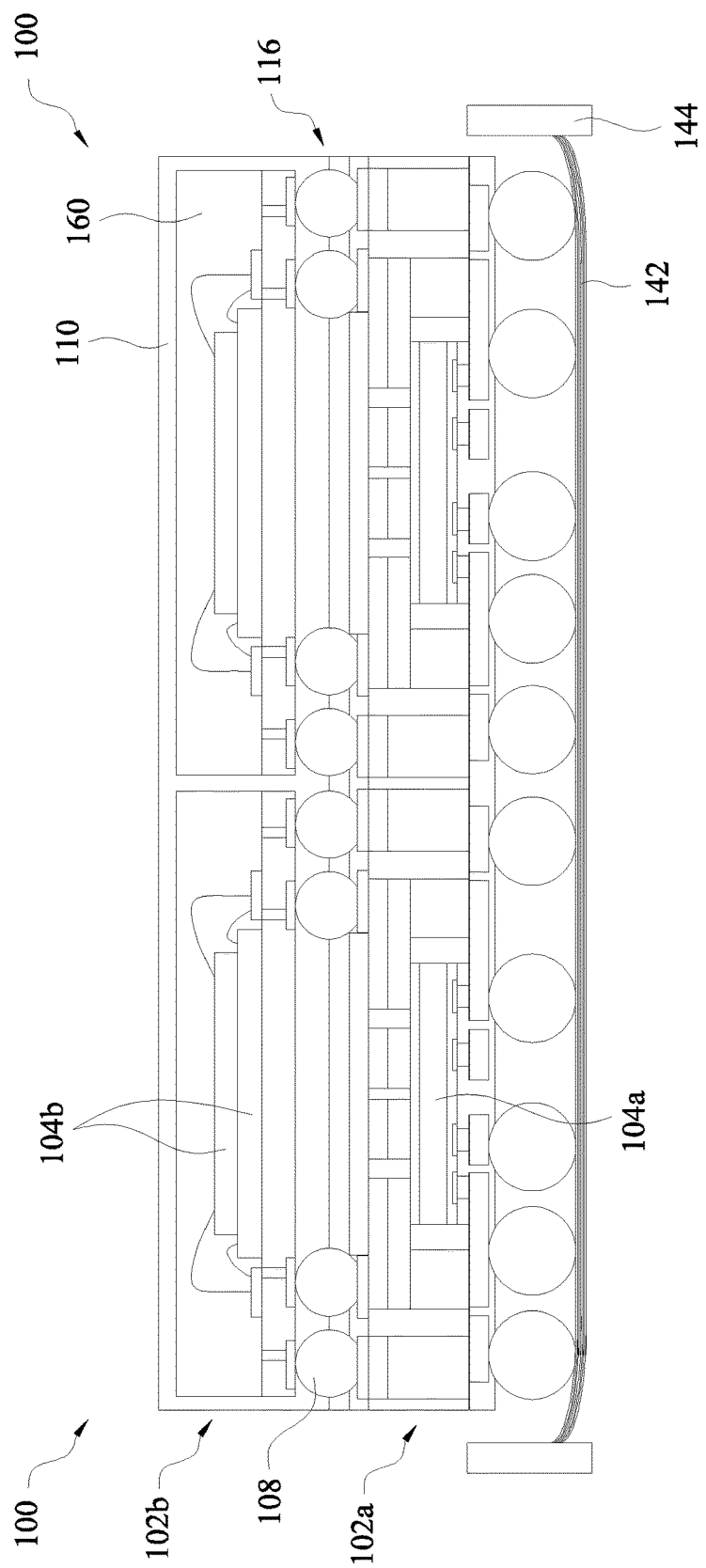
Figure 19:
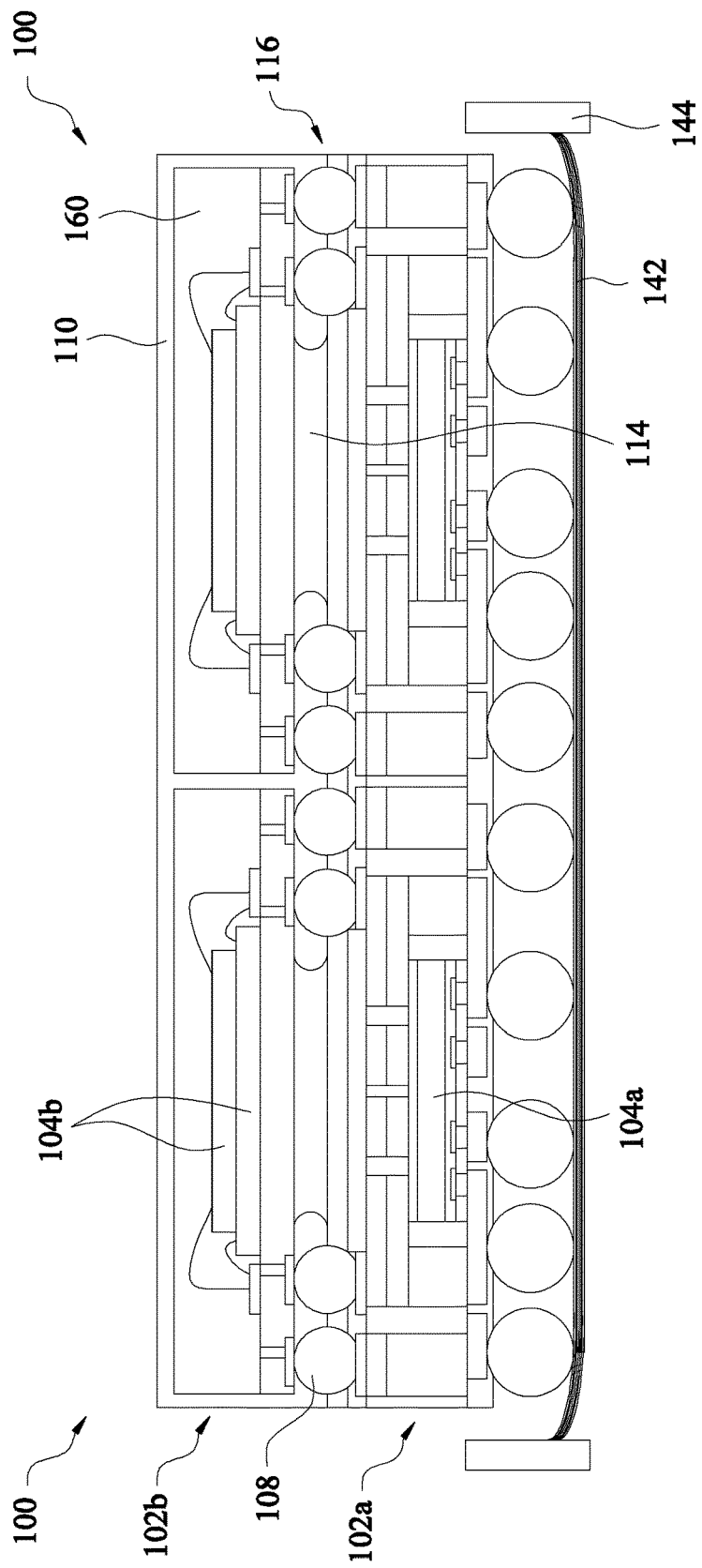

In accordance with some embodiments of the present disclosure, an over-mold structure 110 is then formed over the second devices 102b, as shown in FIG. 18 or 19. In FIG. 18, the over-mold structure 110 comprises a MUF material. In FIG. 19, the over-mold structure 110 comprises a LMC. Either the step shown in FIG. 18 or the step shown in FIG. 19 is performed.

In FIG. 18, the over-mold structure 110 comprising the MUF material is applied using a mold. The MUF material is in liquid form as applied, and is compression molded or injection molding onto the packaged devices, over the top surfaces of the second devices 102b. The MUF material is then cured and forms into a solid. The MUF material flows into and substantially completely fills the spaces 116 between the second devices 102b and the first devices 102a.

In some embodiments, the MUF material comprises organic binders or inorganic fillers with polymer binders that are applied by thermal compression molding, for example. Alternatively, the MUF material may comprise other materials and may be applied using other methods. The over-mold structure 110 comprises a thickness over a top surface of the second devices 102b comprising dimension $d_1$ and a thickness over the sidewalls of the second devices 102b comprising dimension $d_2$ in some embodiments, as described with reference to FIG. 3.

In FIG. 19, the over-mold structure 110 comprising the LMC is applied by laminating on the over-mold structure 110 material. The LMC may comprise a sheet of laminate molding compound (LMC) material that is applied over the top surfaces of the second devices 102b. The sheet of LMC is then compression molded. The LMC is disposed around and between the plurality of connectors 108, yet the LMC is not formed in a central region 114 beneath the second devices 102b.

In some embodiments, the LMC material comprises organic binders and inorganic fillers with polymer binders that are applied by vacuum laminating or thermal compression molding, for example. The over-mold structure 110 comprises a thickness over a top surface of the second devices 102b comprising dimension $d_1$ and a thickness over the sidewalls of the second devices 102b comprising dimension $d_2$ in some embodiments, as described with reference to FIG. 3.

Figure 20:
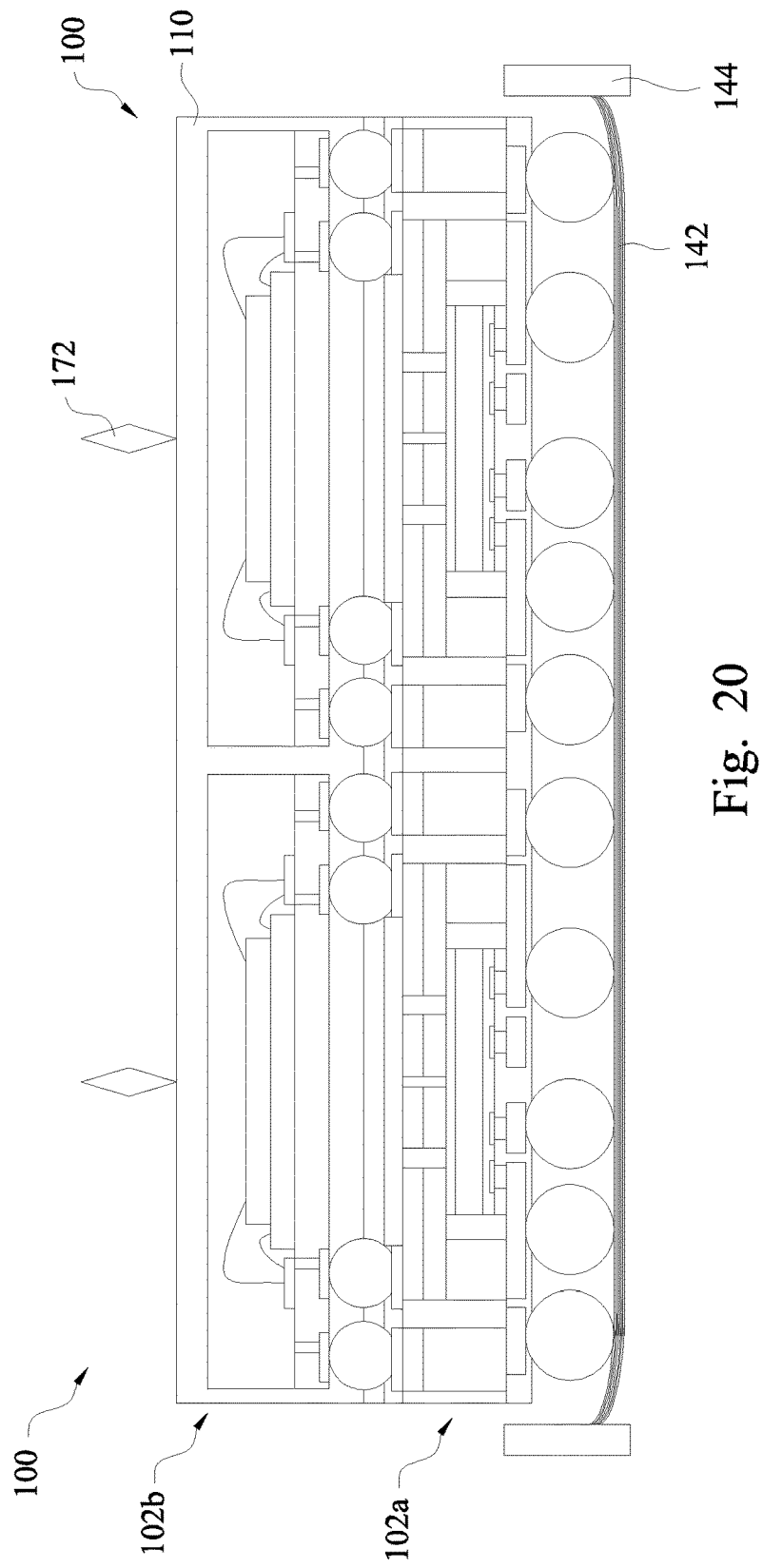
Figure 21:
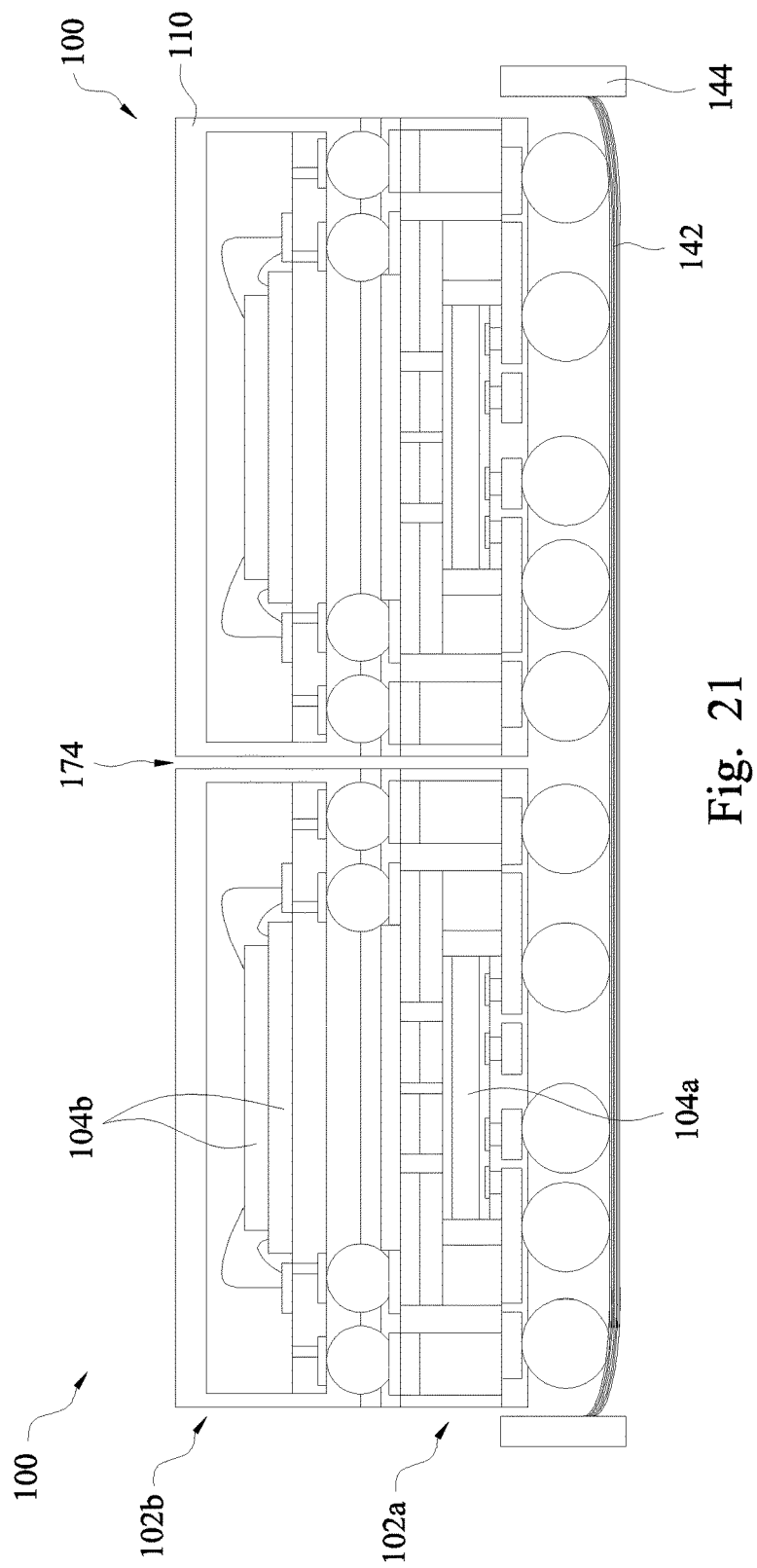
Figure 22:
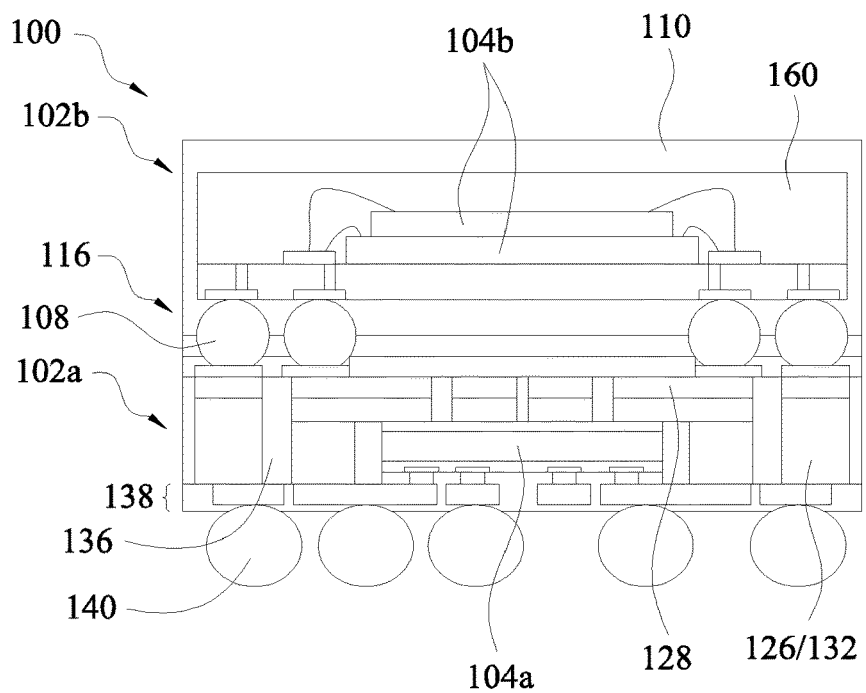
FIGS. 22 and 23 are cross-sectional views showing packaged semiconductor devices in accordance with some embodiments.
Figure 23:
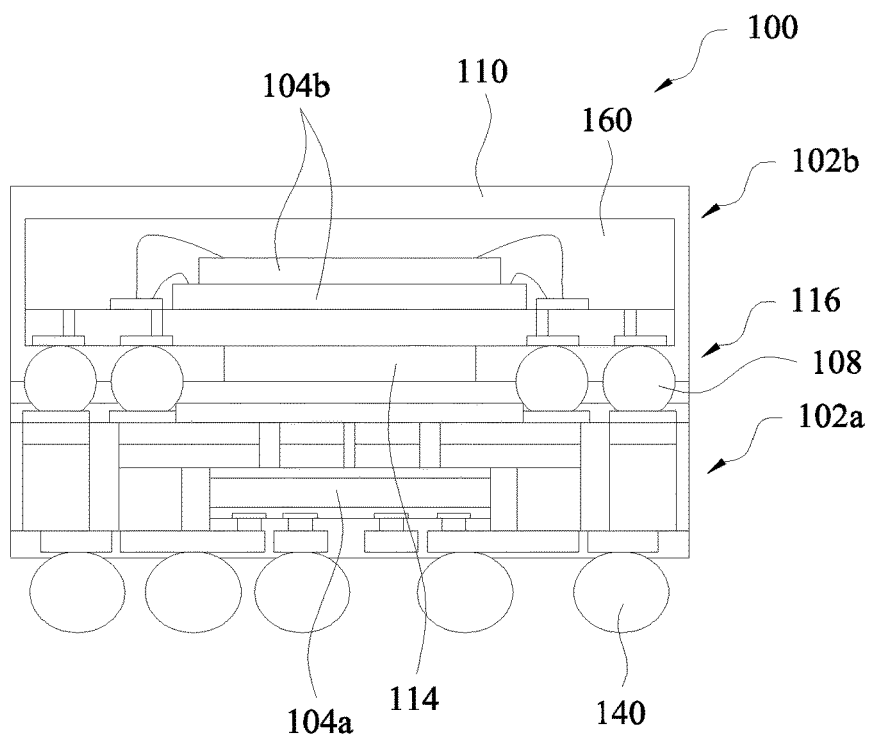

FIGS. 20 and 21 are cross-sectional views illustrating additional processing steps that may be performed after the step shown in FIG. 19, which result in a packaged semiconductor device 100 shown in FIG. 23. The processing steps shown in FIGS. 20 and 21 may also be performed after the step shown in FIG. 18, which result in a packaged semiconductor device 100 shown in FIG. 22.

In the processing step shown in FIG. 20, in some embodiments, the over-mold structure 110 may be marked using a laser marking process 172. The over-mold structure 110 may be marked with an ink or by etching a pattern with a laser to indicate the type of packaged semiconductor devices 100 formed, for example. The over-mold structure 110 may be marked for identification of the type of package on wafer (POW) device that has been packaged, as an example. In some embodiments, a laser marking process 172 is not utilized.

The plurality of partially packaged second integrated circuit dies 104b and the plurality of partially packaged first integrated circuit dies 104a are then singulated to form a plurality of packaged semiconductor devices 100, as shown in FIG. 21. Singulation lines 174 are formed using a saw, laser, or a combination thereof, for example. The singulation lines 174 are formed in the over-mold structure 110 between adjacent second devices 102b and between adjacent first devices 102a. The tape 142 is then removed, leaving a plurality of the packaged semiconductor devices 100 as shown in FIG. 23.

Again, note that in FIGS. 20 and 21, an over-mold structure 110 comprising an LMC is illustrated, which results in the formation of packaged semiconductor devices 100 shown in FIG. 23. Likewise, similar packaging process steps may be performed on the packaged semiconductor devices 100 comprising an over-mold structure 110 which comprises a MUF material shown in FIG. 18, resulting in packaged semiconductor devices 100 shown in FIG. 22.

Figure 24:
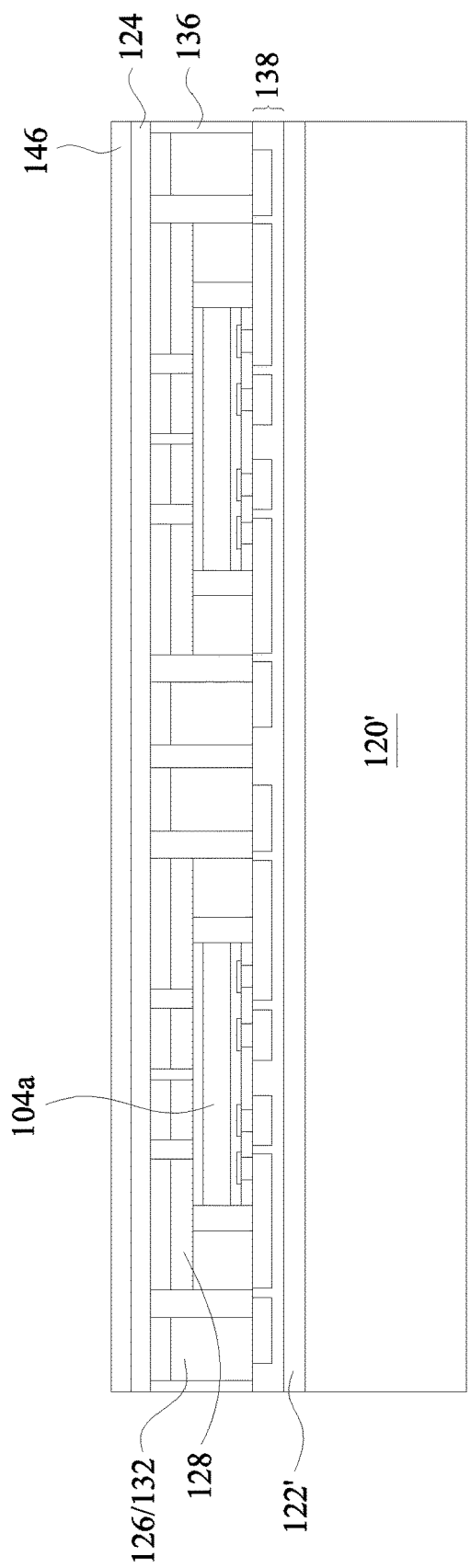
FIGS. 24 through 28 are cross-sectional views that illustrate a method of packaging semiconductor devices at various stages in accordance with some embodiments.

The packaging process flow shown in FIG. 3 through 18 or 19, and FIGS. 20 and 21 is an example of including an over-mold structure 110 in packaged semiconductor devices 100 shown in FIGS. 22 and 23, in accordance with some embodiments of the present disclosure. Other packaging process flows may also be used. For example, FIGS. 24 through 28 are cross-sectional views that illustrate a method of packaging semiconductor devices at various stages in accordance with some embodiments. The carrier 120 shown in FIG. 12 comprises a first carrier 120 in these embodiments. After forming the second RDL 138 as shown in FIG. 12, a second carrier 120' is bonded to the second RDL 138 using a second adhesive 122', and the first carrier 120 shown in FIG. 12 is removed or de-bonded. FIG. 24 is an inverted view of the first devices 102a shown in FIG. 12, illustrating a second carrier 120' bonded to the second RDL 138 by a second adhesive 122'. An insulating material 146 described with reference to FIG. 15 is applied over insulating material 124, as shown in FIG. 24.

Figure 25:
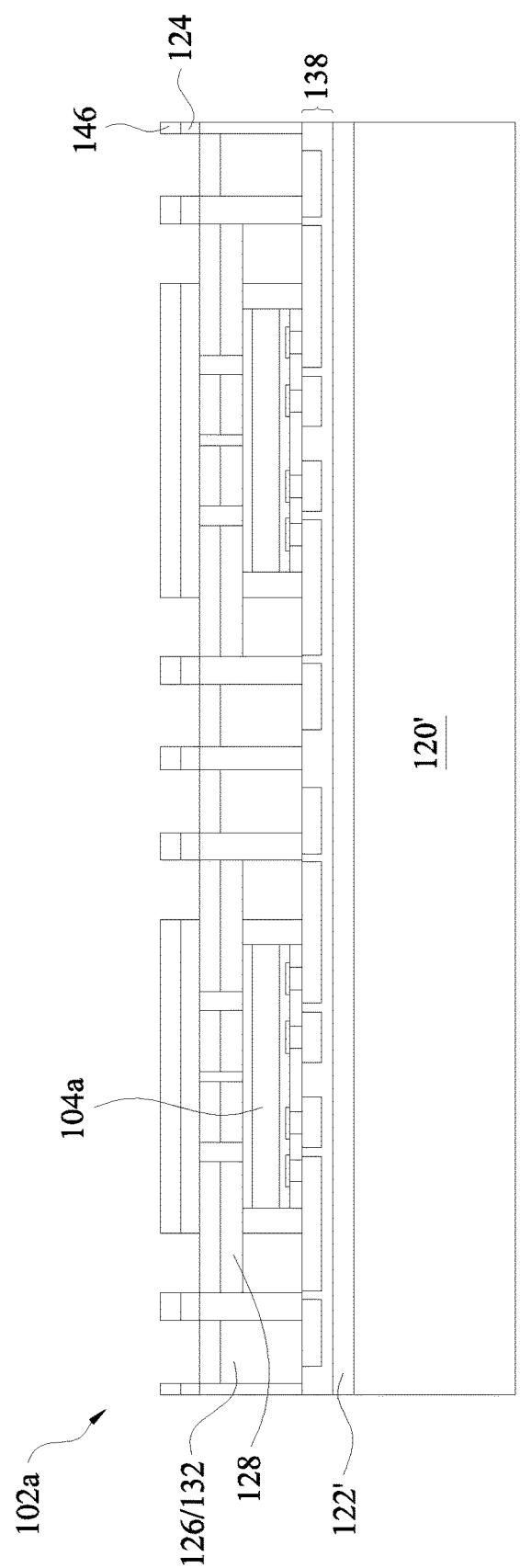
Figure 26:
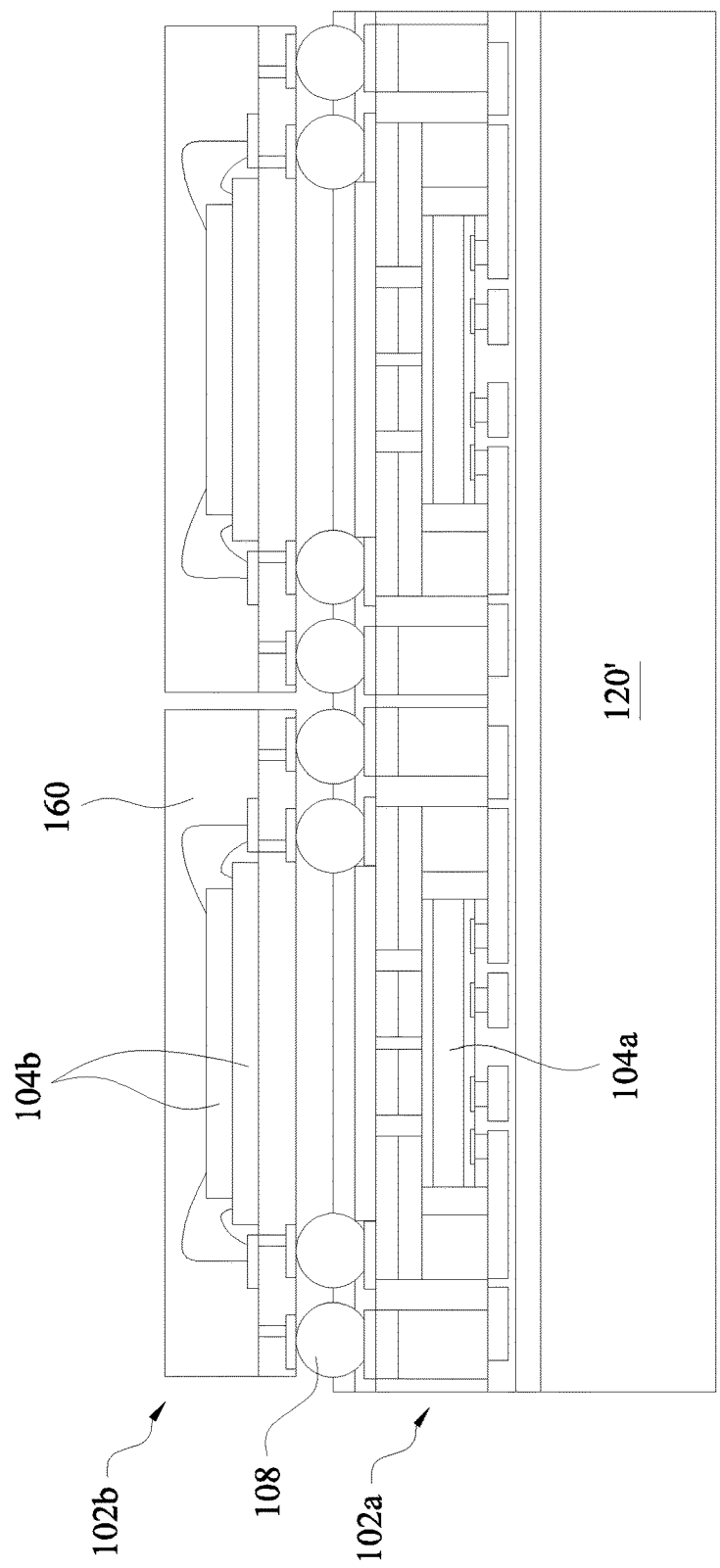
Figure 27:
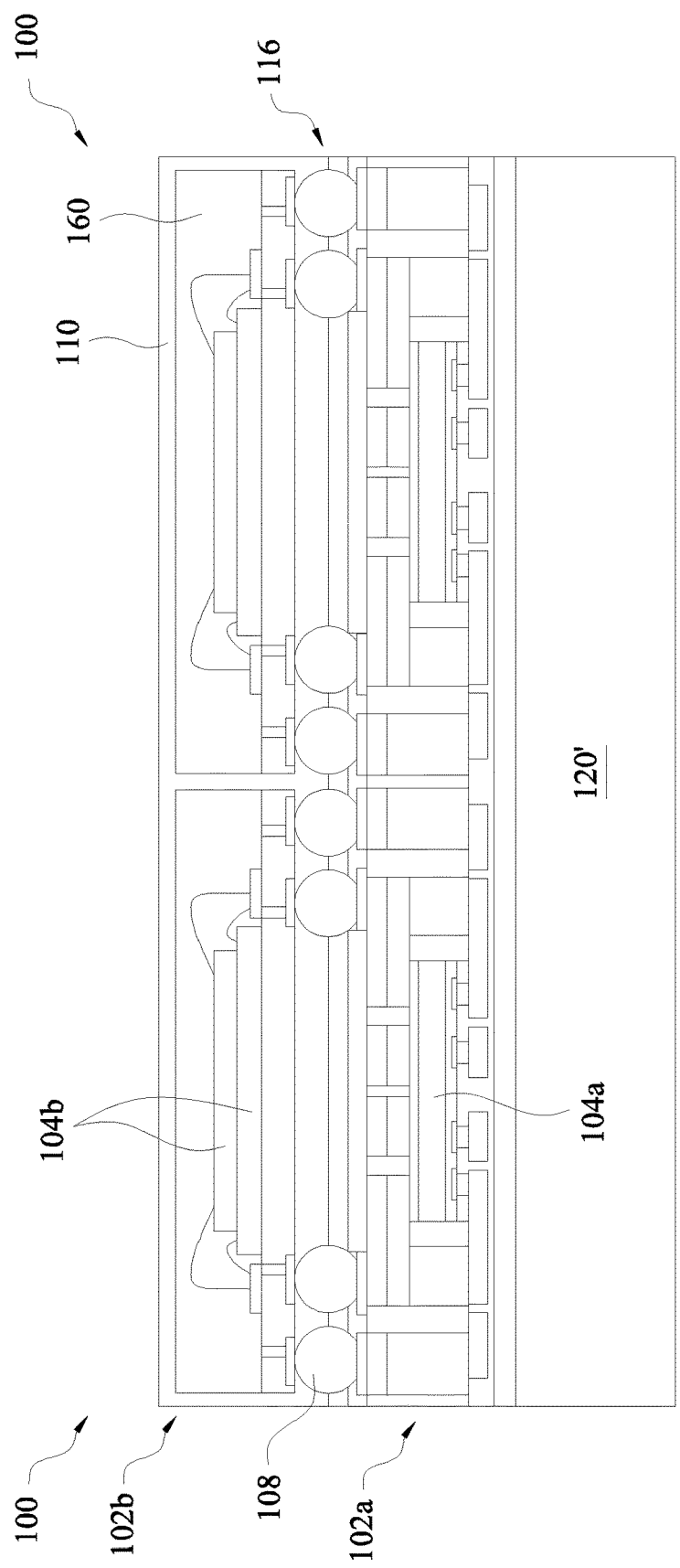
Figure 28:
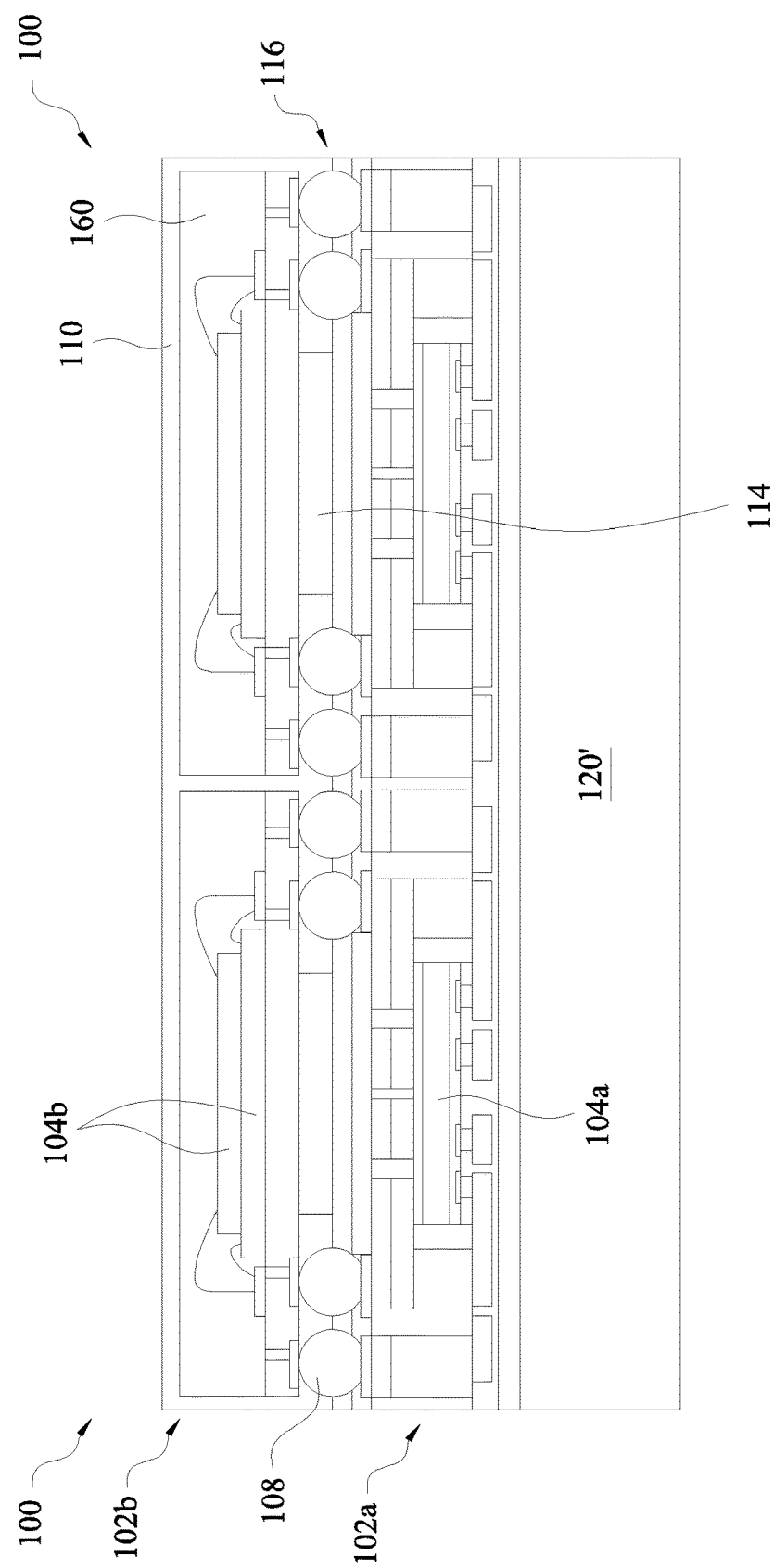

Openings are formed in the insulating materials 146 and 124, as shown in FIG. 25 and as previously described for FIG. 16. A eutectic material is formed within the openings to form connectors 108 which are then used to bond a plurality of second devices 102b to the plurality of first devices 102a, as shown in FIG. 26 and as previously described for FIG. 17. The over-mold structure 110 comprising a MUF material (FIG. 27) or an LMC (FIG. 28) is then applied, as previously described for FIGS. 18 and 19, respectively.

Figure 29:
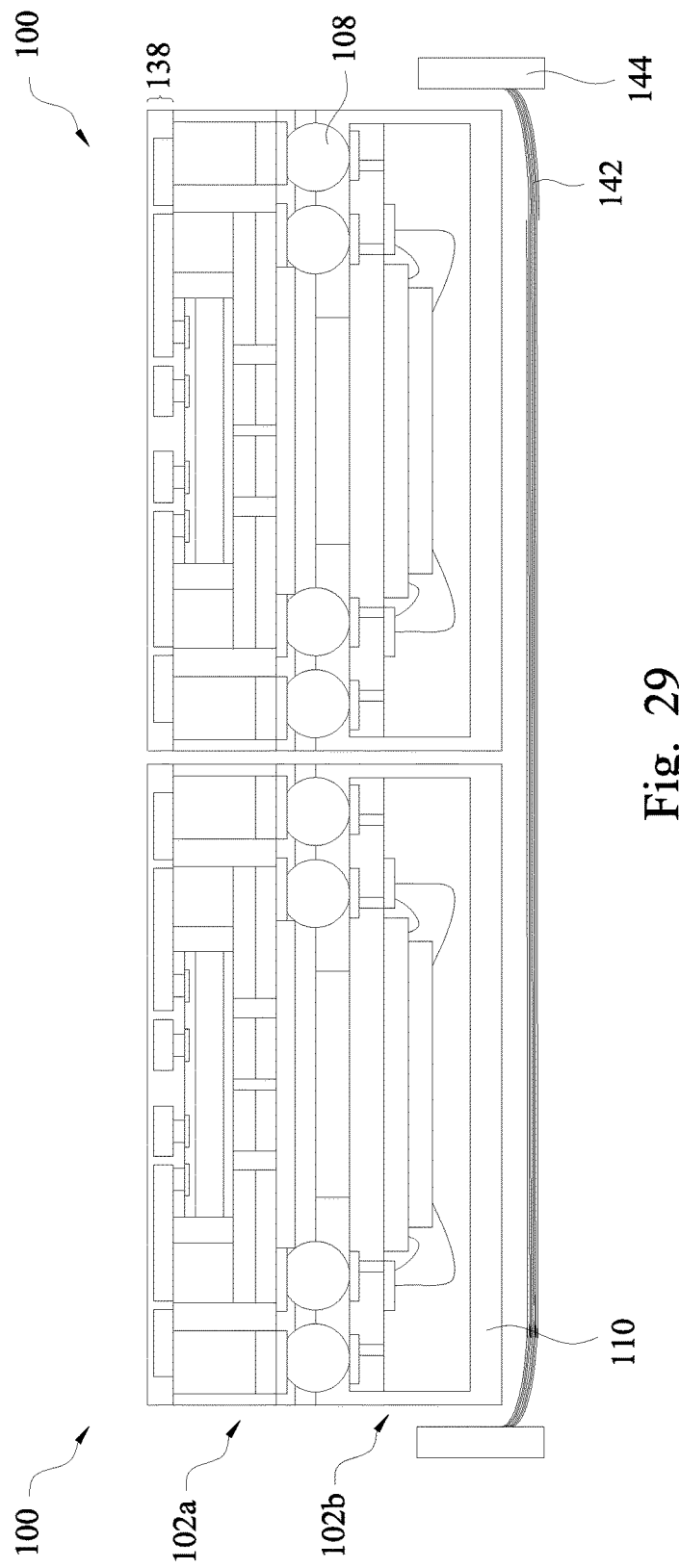
FIGS. 29 through 32 are cross-sectional views that illustrate methods of packaging semiconductor devices at various stages in accordance with some embodiments.
Figure 30:
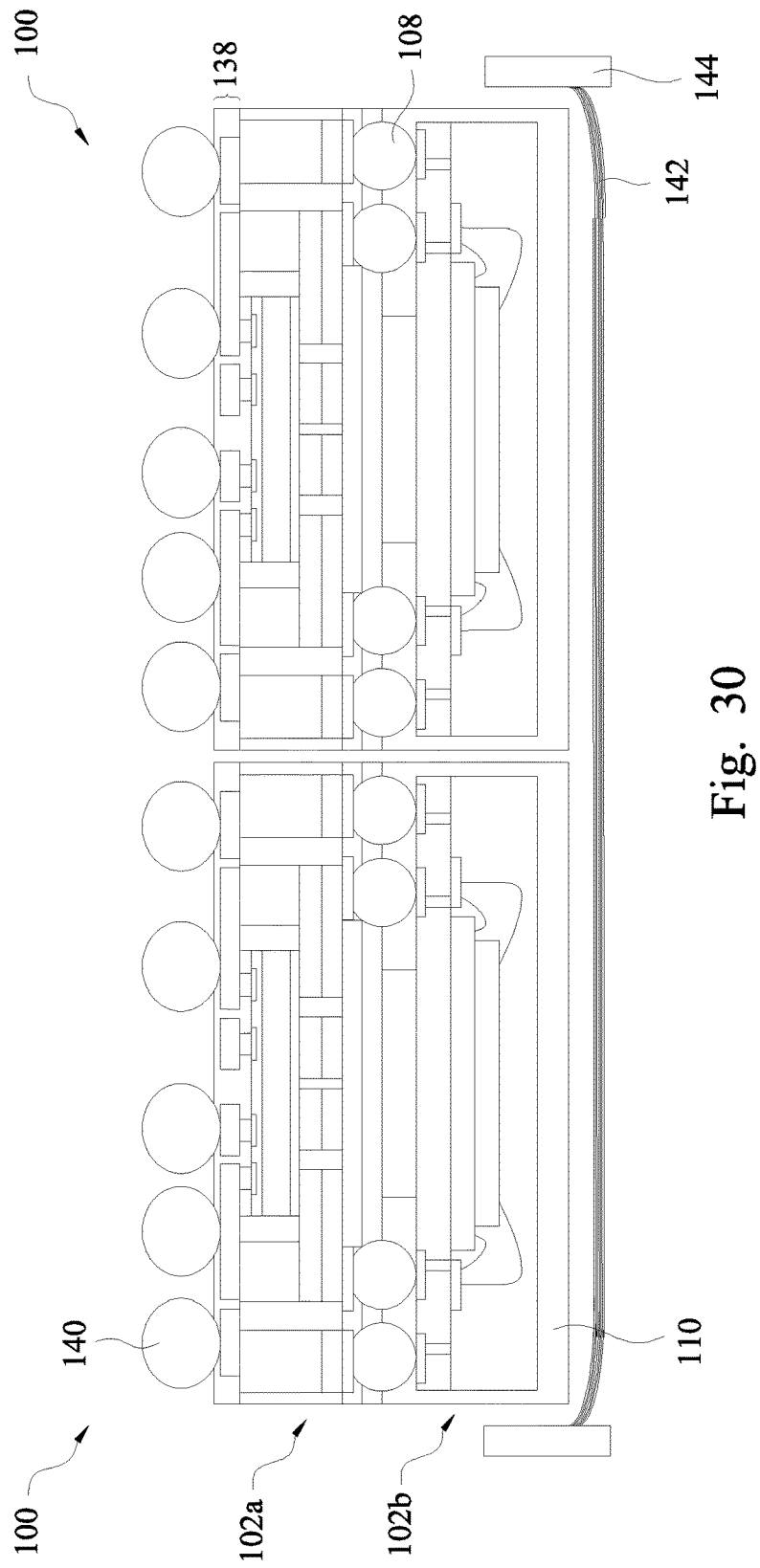

The over-mold structure 110 disposed over the second devices 102b is then attached to a tape 142, as shown in FIG. 29, and the second carrier 120' is removed. A plurality of connectors 140 is coupled to the interconnect structure 138 as shown in FIG. 30, and the packaged semiconductor devices 100 are then singulated and removed from the tape 142, as shown in FIG. 21, (in an inverted view from FIG. 21 during the singulation or dicing process) in some embodiments. The resulting packaged semiconductor devices 100 are shown in FIG. 22 in embodiments wherein the over-mold structure 110 comprises a MUF material and in FIG. 23 in embodiments wherein the over-mold structure 110 comprises an LMC.

Figure 31:
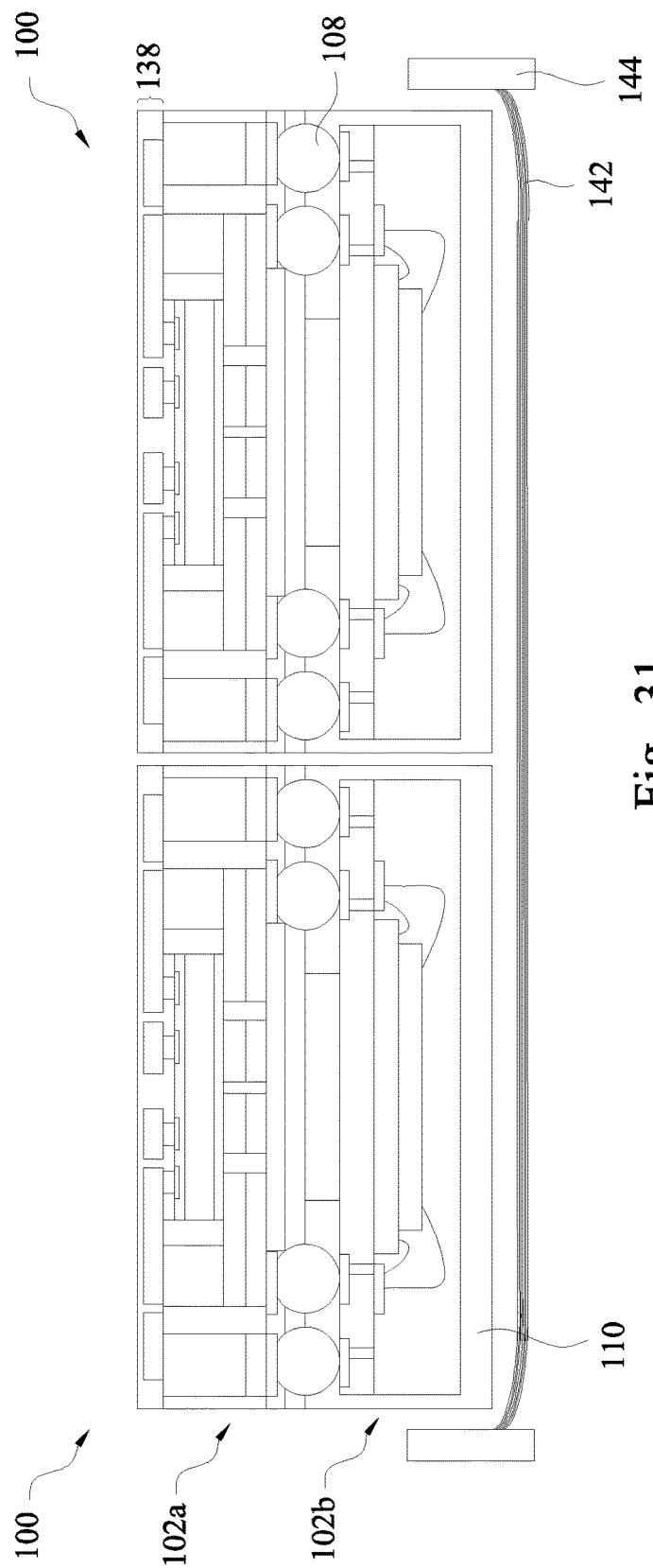
Figure 32:
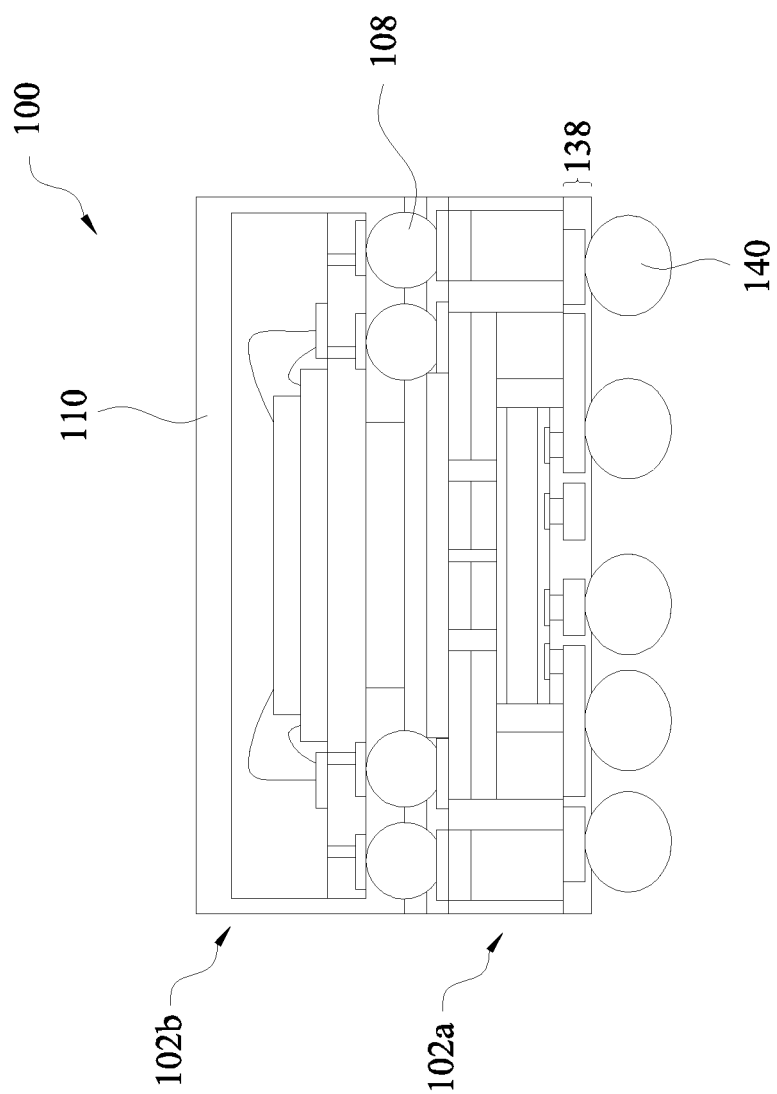

In other embodiments, the connectors 140 may be formed after the plurality of packaged semiconductor devices 100 are singulated, as shown in FIGS. 31 and 32. For example, after the packaging process step shown in FIG. 29, the plurality of packaged semiconductor devices 100 can be singulated, as shown in FIG. 31, and then the tape 142 is removed. The connectors 140 are then formed on each of the plurality of packaged semiconductor devices 100 using a ball mount process, as illustrated in FIG. 32.

Embodiments of the present disclosure are advantageously implementable in and are particularly beneficial when used in package-on-package (PoP) devices, in some applications. The packaged semiconductor devices 100 may comprise PoP devices or system-on-a chip (SOC) devices in some embodiments, as examples.

In some embodiments, the first integrated circuit dies 104a comprise logic devices or processors and the first devices 102a comprise fan-out wiring, and the second integrated circuit dies 104b comprise memory devices such as dynamic random access memory (DRAM) devices, e.g., in some embodiments wherein the over-mold structure is implemented in integration fan-out (InFO) PoP devices. Alternatively, the first integrated circuit dies 104a, the second integrated circuit dies 104b, the first devices 102a, and the second devices 102b may comprise other types of devices, and the over-mold structure 110 may be implemented in other types of applications.

Advantages of some embodiments of the present disclosure include providing over-mold structures that avoid a need to apply an underfill material between devices, which would require an additional packaging process step to apply the underfill material, and which can be difficult to apply to packaged devices having narrow dicing saw streets, for example. Eliminating the need for an underfill material advantageously results in a time and cost savings.

The over-mold structure prevents chipping of edges of the packaged semiconductor devices, e.g., during the singulation process, shipping, and transportation. The over-mold structure also prevents or reduces peeling of passivation and insulating materials of the packaged semiconductor devices. Reliability of packaged semiconductor devices is improved, particularly for drop testing in some applications. Overall, the over-mold structures facilitate POW device production.

The over-mold structure also provides support and increased mechanical strength for subsequent processing steps. The additional support provided by the over-mold structure improves and simplifies singulation processes, for example. The number of processing steps may be reduced by including the over-mold structure in a package. The use of thermal dicing tape and complex sawing processes is avoided in some applications. Furthermore, the packaging methods and structures described herein are easily implementable in packaging process flows and structures.

In some embodiments, a packaged semiconductor device includes a first device and a second device coupled to the first device. The second device includes an integrated circuit die covered by a molding compound. An over-mold structure is disposed over the second device. The over-mold structure is disposed over a top surface and sidewalls of the second device, in some embodiments.

In other embodiments, a method of packaging semiconductor devices includes providing a first device, and coupling a second device to the first device using a plurality of connectors. The second device includes an integrated circuit die covered by a molding compound. An over-mold structure is formed over the second device and around the plurality of connectors.

In yet other embodiments, a method of packaging semiconductor devices includes providing a plurality of first integrated circuit dies, and providing a plurality of second integrated circuit dies. Each of the plurality of second integrated circuit dies includes a molding compound disposed thereon. Each of the plurality of second integrated circuit dies is coupled to one of the first integrated circuit dies. An over-mold structure is formed over the plurality of second integrated circuit dies. The method includes singulating the over-mold structure to form a plurality of packaged semiconductor devices.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of packaging semiconductor devices, the method comprising:
    providing a first device, the first device including a first integrated circuit die, the first device having a topmost surface;
    coupling a second device to the first device using a plurality of connectors, the second device including a second integrated circuit die covered by a molding compound, the second device having a bottommost surface and a topmost surface; and
    after coupling the second device to the first device, laminating a laminate molding compound (LMC) material over the topmost surfaces of the first device and the second device, the LMC material comprising organic binders and inorganic fillers with polymer binders;
    compressing the LMC material, thereby forming an over-mold structure from the compressed LMC material, the over-mold structure being disposed over the first device, over the second device, and around the plurality of connectors, wherein:
        portions of the compressed LMC material formed around the plurality of connectors define a gap region disposed on and between the topmost surface of the first device and the bottommost surface of the second device;
        the gap region is substantially free of the compressed LMC material;
        a lowermost surface of the compressed LMC material is over the topmost surface of the first device; and
        the compressed LMC material comprises a single, continuous material layer extending from the topmost surface of the first device to above the second device.

2. The method according to claim 1, wherein providing the first device comprises providing a first partially packaged semiconductor device, and wherein coupling the second device comprises coupling a second partially packaged semiconductor device.

3. A method of packaging semiconductor devices, the method comprising:
    providing a plurality of first integrated circuit dies;
    providing a plurality of second integrated circuit dies, each of the plurality of second integrated circuit dies including a molding compound disposed thereon;
    coupling each of the plurality of second integrated circuit dies to one of the first integrated circuit dies;
    after coupling the second integrated circuit dies to one of the first integrated circuit dies, laminating a laminate molding compound (LMC) material over topmost surfaces of the first integrated circuit dies and the second integrated circuit dies, the LMC material comprising organic binders and inorganic fillers with polymer binders;
    compressing the LMC material, thereby forming an over-mold structure from the compressed LMC material, the over-mold structure being disposed over the plurality of first integrated circuit dies and over the plurality of second integrated circuit dies, wherein:
        the compressed LMC material extends from between the plurality of first integrated circuit dies and the plurality of second integrated circuit dies to cover the plurality of second integrated circuit dies;
        compressing the LMC material produces a plurality of regions substantially free of the compressed LMC material between the first integrated circuit dies and the second integrated circuit dies;
        the plurality of regions substantially free of the compressed LMC material comprise:
            first boundary surfaces disposed on topmost surfaces of the plurality of first integrated circuit dies; and
            second boundary surfaces disposed on bottommost surfaces of the plurality of second integrated circuit dies; and
        lowermost surfaces of the over-mold structure are over topmost surfaces of the plurality of first integrated circuit dies; and
    singulating the over-mold structure to form a plurality of packaged semiconductor devices.

4. The method according to claim 3, wherein providing the plurality of first integrated circuit dies comprises:
    forming a first redistribution layer (RDL) over a carrier;
    plating a plurality of through-vias over the carrier;
    coupling the plurality of first integrated circuit dies to the carrier;
    forming a molding material around the plurality of through-vias and the plurality of first integrated circuit dies; and
    forming a second RDL over the molding material, the plurality of first integrated circuit dies, and the plurality of through-vias.

5. The method according to claim 4, further comprising:
    forming a plurality of first connectors over the second RDL;
    coupling the plurality of first connectors to a tape;
    removing the carrier;
    forming an insulating material over the first RDL;
    forming openings in the insulating material over the first RDL and the plurality of through-vias; and
    forming a eutectic material in each of the openings in the insulating material, wherein coupling each of the plurality of second integrated circuit dies to one of the first integrated circuit dies comprises reflowing the eutectic material to form a plurality of second connectors.

6. The method according to claim 4, wherein the carrier comprises a first carrier, and wherein the method further comprises:
    coupling a second carrier to the second RDL;
    removing the first carrier;
    forming an insulating material over the first RDL;
    forming openings in the insulating material over the first RDL and the plurality of through-vias; and
    forming a eutectic material in each of the openings in the insulating material, wherein coupling each of the plurality of second integrated circuit dies to one of the first integrated circuit dies comprises reflowing the eutectic material to form a plurality of connectors.

7. The method according to claim 6, further comprising:
coupling the over-mold structure disposed over the plurality of second integrated circuit dies to a tape; and removing the second carrier.

8. The method according to claim 7, wherein forming the plurality of connectors comprises forming a plurality of first connectors, wherein the method further comprises coupling a plurality of second connectors to the second RDL, and singulating the over-mold structure after coupling the plurality of second connectors to the second RDL.

9. The method according to claim 7, wherein forming the plurality of connectors comprises forming a plurality of first connectors, wherein the method further comprises singulating the over-mold structure after removing the second carrier, and coupling a plurality of second connectors to the second RDL.

10. The method according to claim 3, further comprising laser marking the over-mold structure disposed over each of the plurality of second integrated circuit dies.

11. A method of packaging semiconductor devices, the method comprising:
providing a first device, the first device including a first integrated circuit die;
coupling a second device to the first device, the second device comprising a second integrated circuit die and a molding compound, the second integrated circuit die covered with the molding compound;
after coupling the second device to the first device, laminating a laminate molding compound (LMC) material over topmost surfaces of the first device and the second device, the LMC material comprising organic binders and inorganic fillers with polymer binders; and
compressing the LMC material, thereby forming an over-mold structure from the compressed LMC material, the over-mold structure being disposed over the first device and the second device, wherein:
the compressed LMC material extends from between the first device and the second device to a region over the second device;
portions of the compressed LMC material formed between the first device and the second device define a gap region disposed between the first device and the second device;
a topmost boundary of the gap region is disposed on a bottommost surface of the second device;
a bottommost boundary of the gap region is disposed on a topmost surface of the first device; and
a lowermost surface of the over-mold structure is above the topmost surface of the first device.

12. The method of claim 11, wherein providing the first device comprises providing a first partially packaged semiconductor device, and wherein coupling the second device comprises coupling a second partially packaged semiconductor device.

13. The method of claim 11, wherein providing a first device comprises:
forming a first interconnect structure over a carrier;
plating at least one through-via over the carrier;
coupling the first device to the carrier;
forming a molding material around the at least one through-via and the first device; and
forming a second interconnect structure over the molding material, the first device, and the at least one through-via.

14. The method of claim 13, further comprising:
forming a first plurality of connectors over the second interconnect structure;
coupling the first plurality of connectors to a tape;
removing the carrier;
forming an insulating material over the first interconnect structure;
forming an opening in the insulating material over the first interconnect structure and the at least one through-via; and
forming a eutectic material in the opening, wherein coupling the second device to the first device comprises reflowing the eutectic material to form a second plurality of connectors.

15. The method of claim 13, wherein the carrier comprises a first carrier, and wherein the method further comprises:
coupling a second carrier to the second interconnect structure;
removing the first carrier;
forming an insulating material over the first interconnect structure;
forming an opening in the insulating material over the first interconnect structure and the at least one through-via; and
forming a eutectic material in the opening, wherein coupling the second device to the first device comprises reflowing the eutectic material to form a plurality of connectors.

16. The method of claim 15, further comprising:
coupling the over-mold structure disposed over the second device to an adhesive; and
removing the second carrier.

17. The method of claim 15, wherein forming the plurality of connectors comprises forming a plurality of first connectors, and wherein the method further comprises coupling a plurality of second connectors to the second interconnect structure.

18. The method according to claim 1, wherein the LMC is laminated by vacuum laminating.

19. The method according to claim 1, wherein the LMC is laminated by thermal compression molding.

20. The method according to claim 1, further comprising:
after compressing the LMC material, singulating the over-mold structure to form a device package comprising the first integrated circuit die and the second integrated circuit die.

* * * * *